United States Patent
Miyanami et al.

(10) Patent No.: US 10,833,128 B2
(45) Date of Patent: Nov. 10, 2020

(54) REDUCING JUNCTION LEAKAGE AND OCCURRENCE OF DARK CURRENT AT A CONTACT PORTION OF A SOLID-STATE IMAGE DEVICE

(71) Applicant: Sony Corporation, Tokyo (JP)

(72) Inventors: Yuki Miyanami, Kanagawa (JP); Masashi Nakazawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 13/926,400

(22) Filed: Jun. 25, 2013

(65) Prior Publication Data

US 2014/0001454 A1 Jan. 2, 2014

(30) Foreign Application Priority Data

Jul. 2, 2012 (JP) ................................ 2012-148659

(51) Int. Cl.
*H01L 27/30* (2006.01)
*H01L 51/44* (2006.01)
*H01L 27/28* (2006.01)

(52) U.S. Cl.
CPC .......... *H01L 27/301* (2013.01); *H01L 27/286* (2013.01); *H01L 27/307* (2013.01); *H01L 51/44* (2013.01)

(58) Field of Classification Search
CPC ... H01L 27/301; H01L 51/44; H01L 27/1464; H01L 27/14647; H01L 27/307
See application file for complete search history.

(56) References Cited

U.S. PATENT DOCUMENTS

| | | | | |
|---|---|---|---|---|
| 7,683,365 | B2* | 3/2010 | Nii | H01L 27/14621 257/40 |
| 2006/0043436 | A1* | 3/2006 | Fan | H01L 27/14636 257/290 |
| 2011/0019042 | A1* | 1/2011 | Yamaguchi | H01L 27/14632 348/280 |
| 2011/0115003 | A1* | 5/2011 | Okita | H01L 27/14632 257/291 |
| 2011/0156104 | A1* | 6/2011 | Yamaguchi | 257/222 |
| 2012/0286137 | A1* | 11/2012 | Yamaguchi | H01L 27/14607 250/208.1 |

FOREIGN PATENT DOCUMENTS

| | | |
|---|---|---|
| JP | 2003-332551 A | 11/2003 |
| JP | 2011-029337 A | 2/2011 |
| JP | 2011-138927 A | 7/2011 |

* cited by examiner

*Primary Examiner* — Cuong Q Nguyen
*Assistant Examiner* — Peter M Albrecht
(74) *Attorney, Agent, or Firm* — Chip Law Group

(57) ABSTRACT

There is provided a solid-state imaging device including a semiconductor base element, an organic photoelectric conversion layer formed above the semiconductor base element, a contact hole formed in an insulating layer on the semiconductor base element, a conductive layer formed in the contact hole and electrically connecting a photoelectric conversion part which includes the organic photoelectric conversion layer with the semiconductor base element, and a contact portion which is formed by self-alignment with the conductive layer in the contact hole in the semiconductor base element, and connected to the conductive layer.

8 Claims, 18 Drawing Sheets

A

B

C

M

N

REDUCING JUNCTION LEAKAGE AND OCCURRENCE OF DARK CURRENT AT A CONTACT PORTION OF A SOLID-STATE IMAGE DEVICE

BACKGROUND

The present technology relates to a solid-state imaging device and a manufacturing method thereof, and an electronic apparatus having a solid-state imaging device.

In recent years, in a CCD image sensor and a CMOS image sensor, as the pixel size decreases, the number of photons incident on a unit pixel decreases and sensitivity deteriorates, leading to decrease in S/N.

In a widely used pixel arrangement where red, green, and blue pixels are arranged on a planar surface, green and blue lights do not pass through a color filter in the red pixels and are not used in photoelectric conversion, resulting in loss of sensitivity.

Furthermore, when a color signal is generated by pixel interpolation, a false color occurs.

In order to solve these problems, an image sensor has been known in which three photoelectric conversion layers are stacked in a vertical direction to obtain photoelectric conversion signals of three colors with one pixel.

Such a structure of stacking three photoelectric conversion layers in one pixel has been proposed as, for example, a photoelectric conversion part configured to detect a green light is provided above a silicon substrate and two PDs configured to detect blue and red light are stacked inside the silicon substrate (refer to Japanese Patent Laid-Open No. 2003-332551).

Also a back-illuminated structure has been proposed in which a circuit-forming surface is disposed on the opposite side of a light-receiving surface, having a structure in which one layer of photoelectric conversion film is provided above a silicon substrate and two photoelectric conversion parts of two colors are provided in the silicon substrate.

In addition, especially a back-illuminated structure has been proposed in which an organic photoelectric conversion part including the organic photoelectric conversion layer is formed above the silicon substrate (refer to Japanese Patent Laid-Open No. 2011-29337).

In this structure, since no circuits or wires are formed between an inorganic photoelectric conversion part and the organic photoelectric conversion part, the distance between the inorganic photoelectric conversion part and the organic photoelectric conversion part in the same pixel can be decreased. As a result, the F-number dependence of each color can be suppressed, and variation of sensitivity among different colors can be suppressed.

Additionally, a structure having an organic photoelectric conversion part formed above a semiconductor substrate has been proposed in which there is further formed a vertical transfer path including a connection portion, a potential barrier layer and a charge accumulation layer stacked in a vertical direction in the semiconductor substrate (refer to Japanese Patent Laid-Open No. 2011-138927). This structure aims at improving transfer efficiency without impeding miniaturization of pixels by forming the vertical transfer path in the semiconductor base element.

According to Japanese Patent Laid-Open No. 2011-138927, the vertical transfer path is formed as follows.

Firstly, a semiconductor region of the photoelectric conversion part, and the charge accumulation layer and potential barrier layer of the vertical transfer path are formed on a semiconductor layer of an SOI substrate by ion implantation.

Subsequently, the device is reversed upside down to remove a substrate and a BOX layer constituting the SOI substrate so as to expose a rear surface that is to be a light incident surface of the semiconductor layer.

Next, n-type impurities are ion-implanted with high concentration into an upper region of the potential barrier layer of the exposed outermost front surface of the semiconductor layer to form the connection portion (hereinafter, referred to as contact portion), and activation is carried out by laser annealing.

SUMMARY

In the case of ion implantation region activation by laser annealing processing, melt laser annealing may be used for melting silicon.

However, due to a relation between a laser shot size and a size of the contact portion, large portion including regions other than the contact portion are to be melted. For this reason, since the impurities are diffused laterally from the ion implantation region, a depletion layer is spread and a contact plug portion may be damaged on fabrication to deteriorate junction leakage.

Also, the impurity lateral diffusion may cancel a negative fixed charge on the silicon surface, possibly leading to deterioration of dark current.

Accordingly, it is desirable to provide a solid-state imaging device in which the impurities are prevented from diffusing and the contact portion connecting with the organic photoelectric conversion layer can be formed by laser annealing, and a manufacturing method thereof, and an electronic apparatus having the solid-state imaging device.

According to an embodiment of the present disclosure, there is provided a solid-state imaging device including a semiconductor base element, an organic photoelectric conversion layer formed above the semiconductor base element, a contact hole formed in an insulating layer on the semiconductor base element, a conductive layer formed in the contact hole and electrically connecting a photoelectric conversion part which includes the organic photoelectric conversion layer with the semiconductor base element, and a contact portion which is formed by self-alignment with the conductive layer in the contact hole in the semiconductor base element, and connected to the conductive layer.

According to an embodiment of the present disclosure, there is provided a manufacturing method of a solid-state imaging device having an organic photoelectric conversion layer including forming a reflecting film reflecting laser light on an insulating layer formed on a semiconductor base element, processing the reflecting film and the insulating layer, and forming a contact hole that reaches the semiconductor base element, forming a contact portion in the semiconductor base element under the contact hole by laser annealing, forming a conductive layer in the contact hole with being connected to the contact portion in the semiconductor base element, and forming a photoelectric conversion part that is electrically connected with the conductive layer and includes the organic photoelectric conversion layer above the semiconductor base element.

The electronic apparatus according to an embodiment of the present technology includes an optical system, the solid-state imaging device according to an embodiment of the present technology described above, and a signal processing circuit for processing an output signal of the solid-state imaging device.

According to the solid-state imaging device in an embodiment of the present technology described above, since the contact portion connected with the conductive layer is formed by self-alignment with the conductive layer in the contact hole, the impurities in the contact portion do not diffuse outside the contact hole. This can suppress the junction leakage due to the spread depletion layer and the occurrence of the dark current due to the canceled negative fixed charge which are caused by diffusion of the impurities in the contact portion.

According to the manufacturing method of the solid-state imaging device in an embodiment of the present technology described above, the reflecting film reflecting the laser light is formed on the insulating layer on the semiconductor base element, the reflecting film and the insulating layer are processed to form the contact hole, and the contact portion is formed in the semiconductor base element below the contact hole by laser annealing.

In laser annealing, since the reflecting film reflects the laser light, only a portion of the semiconductor base element under the contact hole is irradiated with the laser light. For this reason, the portion under the contact hole may be selectively melted, recrystallized and activated to form the contact portion by self-alignment with the contact hole, allowing the impurities of the contact portion not to diffuse outside the contact hole. This can suppress the junction leakage due to the spread depletion layer and the occurrence of the dark current due to the canceled negative fixed charge which are caused by diffusion of the impurities in the contact portion.

Then, since the conductive layer is formed in the contact hole in contact with the contact portion of the semiconductor base element, the conductive layer in the contact hole and the contact portion are formed by self-alignment.

According to an electronic apparatus in an embodiment of the present technology described above, since the solid-state imaging device in an embodiment of the present technology is involved, the junction leakage due to the spread depletion layer and the occurrence of the dark current due to the canceled negative fixed charge can be suppressed in the solid-state imaging device.

According to the present technology described above, since the junction leakage and the occurrence of the dark current can be suppressed, the contact portion brought into electrically contact with the organic photoelectric conversion layer can be formed by laser annealing with no difficulties. Then, improvements in reliability and image quality can be secured in the solid-state imaging device and the electronic apparatus including the solid-state imaging device.

DETAILED DESCRIPTION OF THE EMBODIMENT(S)

Figure 1:
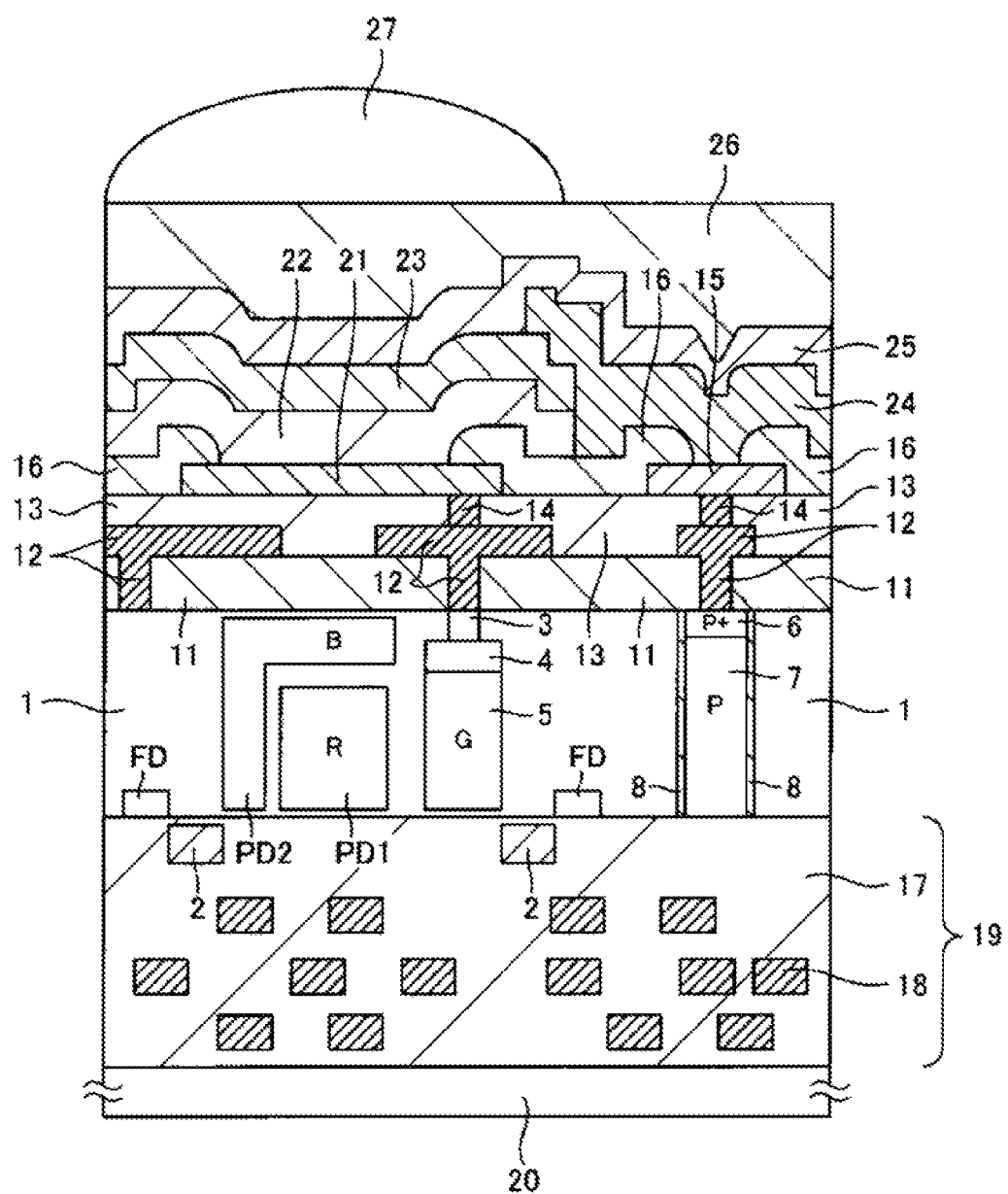
FIG. 1 is a schematic structural view (cross-sectional view of a main part) of a solid-state imaging device according to a first embodiment.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, a description is given of the best mode for carrying out the present technology (referred to as an embodiment).

The description will proceed in the following order.
1. First embodiment (solid-state imaging device and manufacturing method thereof)
2. Second embodiment (manufacturing method of solid-state imaging device)
3. Third embodiment (manufacturing method of solid-state imaging device)
4. Fourth embodiment (electronic apparatus)

1. First Embodiment

Solid-State Imaging Device and Manufacturing Method Thereof

A schematic structural view (cross-sectional view of the main part) of a first embodiment of a solid-state imaging device is shown in FIG. 1.

In the embodiment, the present technology is applied to a CMOS-type solid-state imaging device (CMOS image sensor).

FIG. 1 shows a cross-sectional view of one pixel of the solid-state imaging device.

The solid-state imaging device in the embodiment includes a semiconductor base element 1 having two photoelectric conversion parts PD1 and PD2 stacked in a depth direction as shown in FIG. 1. The photoelectric conversion parts PD1 and PD2 each are constituted by a photodiode which is formed inside the semiconductor base element 1.

An upper surface of the semiconductor base element 1 in the figure is a light incident surface and a lower surface thereof is a circuit-formed surface.

On a circuit-formed surface side of the semiconductor base element 1, a pixel transistor such as an amplifier transistor is formed in each pixel and a peripheral circuit such as a logic circuit is formed in a region to be a peripheral circuit part, which are not shown in the figure.

The semiconductor base element 1 is made of semiconductor materials such as silicon.

The semiconductor base element 1 may be a semiconductor substrate, a semiconductor substrate and a semiconductor epitaxial layer thereon, a semiconductor layer on an insulating layer, or the like. A silicon layer of an SOI substrate, the SOI substrate having a silicon layer formed on a silicon substrate via a silicon oxide film, may also be used for the semiconductor base element 1.

Of two photoelectric conversion parts PD1 and PD2, a first photoelectric conversion part PD1 on a lower layer side photoelectric-converts a red R light of long wavelength. A second photoelectric conversion part PD2 on an upper side photoelectric-converts a blue B light of short wavelength. These constitute a vertical spectroscopic image sensor.

The second photoelectric conversion part PD2 includes a portion stacked to the first photoelectric conversion part PD1 and a portion (plug part) extended downward in the figure for connecting with the circuit on the circuit-formed surface.

With respect to the second photoelectric conversion part PD2, a floating diffusion FD is provided leftward thereof via a transfer gate 2 inside the semiconductor base element 1.

With respect to the first photoelectric conversion part PD1, the transfer gate and the floating diffusion are provided respectively in portions not shown.

In the semiconductor base element 1, a charge accumulation part 5 which accumulates a charge obtained by photoelectric-converting a green G light at an organic photoelectric conversion part described later in detail is formed on the right side of the photoelectric conversion parts PD1 and PD2. Further, an overflow bather 4 and an $N^+$ contact portion 3 are formed on the charge accumulation part 5. The charge accumulation part 5 is formed including an N-type semiconductor region and the overflow barrier 4 is formed including a low concentration P-type semiconductor region.

With respect to the charge accumulation part 5, the floating diffusion FD is provided rightward thereof via the transfer gate 2.

In the semiconductor base element 1, formed further rightward are a $P^+$ contact portion 6 and a P-type plug region 7 which connect the organic photoelectric conversion part with the circuit on the circuit-formed surface.

Around the contact portion 6 and the plug region 7, an insulation film 8 is formed which insulates the semiconductor base element 1 from the contact portion 6 and the plug region 7.

The insulation film 8 may be formed using, for example, a silicon oxide film and a silicon nitride film.

On the lower side of the circuit-formed surface of the semiconductor base element 1, a wiring part (multilayer interconnection part) 19 is formed which includes a plurality of wiring layers 18 vertically stacked through an interlayer dielectric layer 17. In FIG. 1, three layers of wiring layers 18 are shown under the transfer gate 2.

A support substrate 20 is provided below the wiring part (multilayer interconnection part) 19.

An insulating layer 11 is formed on the light incident surface (upper surface) of the semiconductor base element 1.

The insulating layer 11 is desirably made of a material having low interface state in order to reduce an interface state with the semiconductor base element 1 and suppress the dark current occurring from an interface between the semiconductor base element 1 and the insulating layer 11.

Examples of the insulating layer 11 include a stacked structure film of a hafnium oxide ($HfO_2$) film formed by an ALD (atomic layer deposition) method and a $SiO_2$ film formed by a plasma CVD method. However, the structure and film formation method thereof are not limited thereto.

A conductive layer 12 is formed inside a contact hole as well as on the insulating layer 11, the contact hole being formed in the insulating layer 11. The conductive layer 12 includes a conductive plug in the contact hole and a wiring layer on the insulating layer 11.

The $N^+$ contact portion 3 and the $P^+$ contact portion 6 which are formed inside the semiconductor base element 1 near the upper surface are individually connected with the conductive plugs of the conductive layers 12.

Since a portion of the wiring layer of the conductive layer 12 is formed extending laterally from a portion of the conductive plug, a light can be blocked off from a portion under the conductive layer 12 of the semiconductor base element 1. That is, as shown in FIG. 1, the plug part of the second photoelectric conversion part PD2, contact portion 3, overflow barrier 4, charge accumulation part 5, contact portion 6 and plug region 7 can be blocked from the light by the conductive layer 12.

A good light-blocking conductive material is used for the conductive layer 12. Further, the conductive layer 12 has to be in contact with the semiconductor base element 1. As for a material of the conductive layer 12, a barrier metal having a stacked film of Ti and TiN, and a structure including W (tungsten) may be used, for example. Note that the structure and material are not limited thereto and other materials may be used for the conductive layer 12.

The contact portion 3 connected with the conductive layer 12 is formed including an $N^+$ region, that is, a high concentration N-type impurity region. This allows an ohmic contact between the contact portion 3 and the conductive layer 12 thereon, such that a charge obtained by photoelectric-converting by the organic photoelectric conversion part can be sent to the charge accumulation part 5 in the semiconductor base element 1 without loss.

An insulating layer 13 is formed to cover the conductive layer 12. The insulating layer 13 may be formed without using a material of lower interface state unlike the insulating layer 11 under thereof, but using a general insulating material.

The insulating layer 13 has a contact hole formed on the conductive layer 12 corresponding to each of the contact portions 3 and 6, and a conductive plug layer 14 is formed to fill the contact hole. The conductive plug layer 14 may be formed using a stacked film of a TiN film and a W film, for example.

A lower electrode 21 of the organic photoelectric conversion part and a wiring layer 15 are formed above the insulating layer 13 each connecting to the conductive plug layers 14.

The lower electrode 21 is connected to the conductive plug layer 14 on the conductive layer 12 connected to the N+ contact portion 3.

The wiring layer 15 is connected to the conductive plug layer 14 on the conductive layer 12 connected to the $P^+$ contact portion 6.

The lower electrode 21 is formed using a transparent conductive material in order to make a light incident on the photoelectric conversion parts PD1 and PD2 in the semiconductor base element 1.

The wiring layer 15 may be made using the same material as the lower electrode 21 or a material different from the lower electrode 21. In the case where the same material as the lower electrode 21 is used for the wiring layer 15, patterning may be performed on one layer to form the wiring layer 15 and the lower electrode 21 at the same time.

On the insulating layer 13, an insulating layer 16 is formed laterally across edges of the lower electrode 21 and the wiring layer 15.

An organic photoelectric conversion layer 22 made of an organic photoelectric conversion material is formed in contact with and on the lower electrode 21. The organic photoelectric conversion layer 22 is formed extending leftward from the lower electrode 21.

Further, an upper electrode 23 is formed in contact with and on the organic photoelectric conversion layer 22. The upper electrode 23 has a right edge aligned with the organic photoelectric conversion layer 22. The upper electrode 23 also has a left edge, not shown, aligned with the organic photoelectric conversion layer 22.

The upper electrode 23 is formed using a transparent conductive material in order to make a light incident on the organic photoelectric conversion layer 22.

The lower electrode 21, the organic photoelectric conversion layer 22, and the upper electrode 23 constitute the organic photoelectric conversion part, which detects the green G light.

The organic photoelectric conversion layer 22 absorbs the green G light to perform photoelectric conversion, and has a function as a color filter to pass the blue B and red R lights through.

Since the organic photoelectric conversion part including the organic photoelectric conversion layer 22 and the photoelectric conversion parts PD1 and PD2 formed in the semiconductor base element 1 are vertically stacked, the lights of three colors R, G and B can be received and detected by one pixel.

Examples of the transparent conductive material of the lower electrode 21 and the upper electrode 23 include, for example, indium tin oxide (ITO), and aluminum zinc oxide (e.g., AZO) obtained by adding Al as a dopant to $SnO_2$ and ZnO added with a dopant. Also, gallium zinc oxide (e.g., GZO) obtained by adding Ga as a dopant to ZnO, indium zinc oxide (e.g., IZO) obtained by adding In as a dopant to ZnO can be used. Furthermore, CuI, $InSbO_4$, ZnMgO, $CuInO_2$, $MgIn_2O_4$, CdO, $ZnSnO_3$ and the like can be used.

Examples of the organic photoelectric conversion material for photoelectric-converting the green G light for the organic photoelectric conversion layer 22 include, for example, rhodamine colorants, merocyanine colorants, quinacridone colorants and the like.

Additionally, the organic photoelectric conversion layer 22 may be of a structure, not shown, in which an undercoating film, an electron-blocking film, a photoelectric conversion film, a hole blocking film, a hole-blocking buffer film, and a work-function-adjusting film are stacked on a lower electrode, as disclosed in Japanese Patent Laid-Open No. 2007-81137 for example.

The organic photoelectric conversion layer 22 preferably contains at least one of an organic p-type semiconductor and an organic n-type semiconductor.

Examples of the organic p-type semiconductor and the organic n-type semiconductor particularly preferably include quinacridone derivatives, naphthalene derivatives, anthracene derivatives, phenanthrene derivatives, tetracene derivatives, pyrene derivatives, perylene derivatives, and fluoranthene derivatives. Polymers such as phenylene vinylene, fluorene, carbazole, indole, pyrene, pyrrole, picoline, thiophene, acetylene and diacetylene, and derivatives thereof may also be used. Other examples of the material for the organic photoelectric conversion layer 22 preferably include metal complex colorants, cyanine colorants, merocyanine colorants, phenylxanthene colorants, triphenylmethane colorants, rhodacyanine colorants, xanthene colorants, macrocyclic azaannulene colorants, azulene colorants, naphthoquinone, anthraquinone colorants, anthracene, fused polycyclic aromatic compounds such as pyrene, chain compounds obtained by fusing an aromatic ring compound or a heterocyclic compound, quinoline having a squarylium group and a croconic methine group as a bonding chain, nitrogen-containing heterocyclic compounds such as benzothiazole and benzoxazole, and cyanine-like colorants linked through a squarylium group and a croconic methine group.

Preferred examples of the metal complex colorants preferably include dithiol metal complex colorants, metallic phthalocyanine colorants, metallic porphyrin colorants, and ruthenium complex colorants. A ruthenium complex colorant is particularly preferable. However, the material is not limited to those described above.

A wiring layer 24 is formed in contact with the right edge on the upper electrode 23. The wiring layer 24 is formed also in contact with and on the wiring layer 15.

This brings the upper electrode 23 of the organic photoelectric conversion part into electrically contact with a circuit device on the lower surface side of the semiconductor base element 1 via each of the wiring layer 24, wiring layer 15, contact portion 6, and conductive plug region 7.

Examples of the material of the wiring layer 24 include W, Ti, TiN, Al and the like, for example, but not limited thereto.

On the upper electrode 23 of the organic photoelectric conversion part, a passivation layer 25 is formed to cover over the organic photoelectric conversion layer 22 and protect the organic photoelectric conversion layer 22. The passivation layer 25 covers also on the wiring layer 24.

A planarizing layer 26 is formed on the passivation layer 25 to planarize the surface thereof. An on-chip lens 27 is formed on the planarizing layer.

In this embodiment, the contact portion 3 is particularly formed by self-alignment with the conductive plug of the conductive layer 12. For this reason, the contact portion 3 is formed to have a width narrower than the overflow bather 4 and charge accumulation part 5, suppressing the depletion layer spreading from the contact portion 3 to the photoelectric conversion parts PD1 and PD2.

In FIG. 1, the $P^+$ contact portion 6 is formed to have the same width as the plug region 7, however, the $P^+$ contact portion 6 may also be formed by self-alignment with the conductive plug of the conductive layer 12.

The solid-state imaging device according to the embodiment may be manufactured in a manner described as follows, for example.

Figure 2:
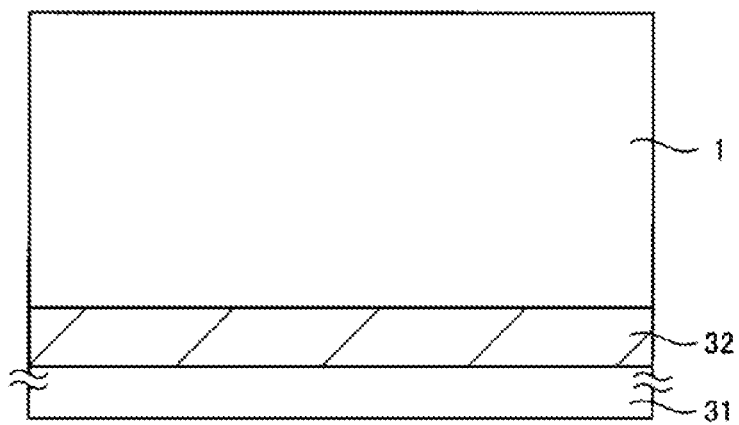
FIGS. 2A and 2B are diagrams illustrating a process of manufacturing of the solid-state imaging device of FIG. 1.
Figure 2:
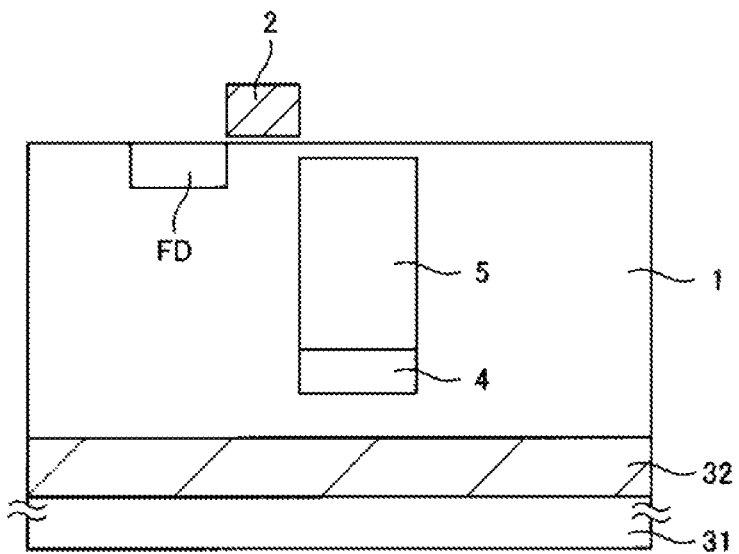

As shown in FIG. 2A, an SOI substrate in which a silicon substrate 31, a BOX layer ($SiO_2$ film) 32, and a silicon layer are stacked is used, and the silicon layer of the SOI substrate is utilized as the semiconductor base element 1.

Firstly, the semiconductor region and the insulation film are formed in the semiconductor base element 1. Then, the transfer gate 2, and the pixel transistor and the circuit devices such as the logic circuit of the peripheral circuit part not shown in FIG. 1 are formed for the semiconductor base element 1.

A cross-sectional view of the main part in this state is shown in FIG. 2B. In FIG. 2B, the overflow barrier 4, the charge accumulation part 5, the floating diffusion FD and the transfer gate 2 are shown. At this time, two photoelectric conversion parts PD1 and PD2, the contact portion 6, the plug region 7, and the insulation film 8 which are shown in FIG. 1 are also formed in the semiconductor base element 1, but not shown in FIG. 2B.

Figure 3:
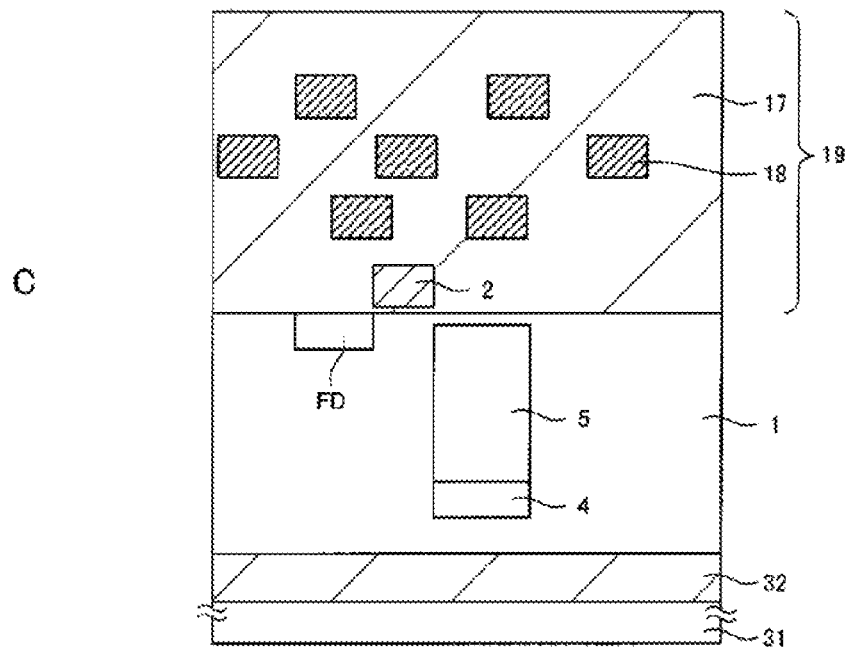
FIGS. 3C and 3D are diagrams illustrating a process of manufacturing of the solid-state imaging device of FIG. 1.
Figure 3:
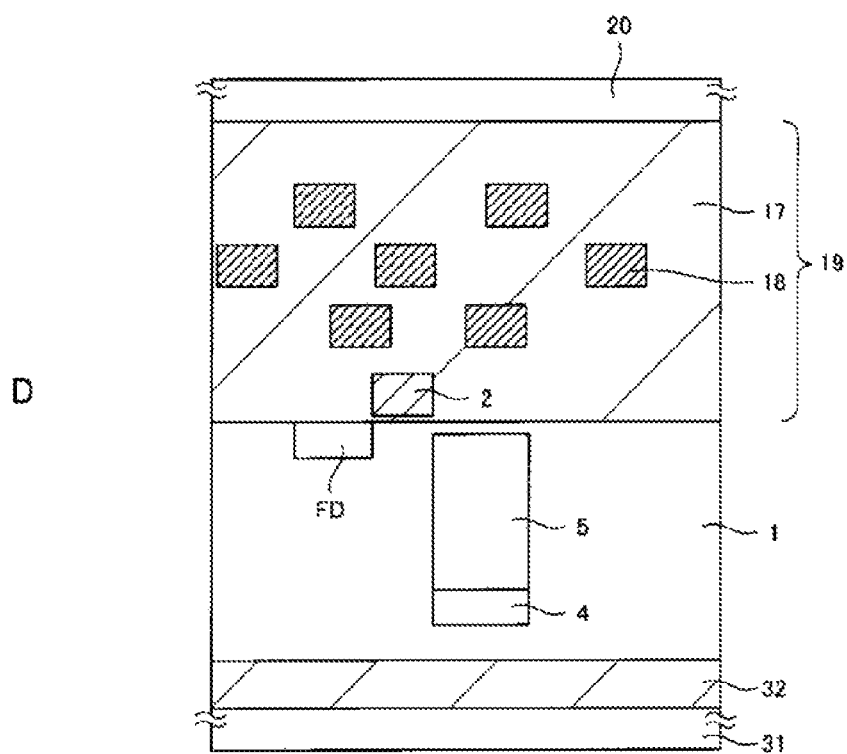

Subsequently, as shown in FIG. 3C, the wiring part (multilayer interconnection layer) 19 having the plurality of wiring layers 18 arranged is formed on the semiconductor base element 1 and the transfer gate 2 via the interlayer dielectric layer 17.

Thereafter, as shown in FIG. 3D, a support substrate 20 is adhered to the wiring part (multilayer interconnection layer) 19.

Figure 4:
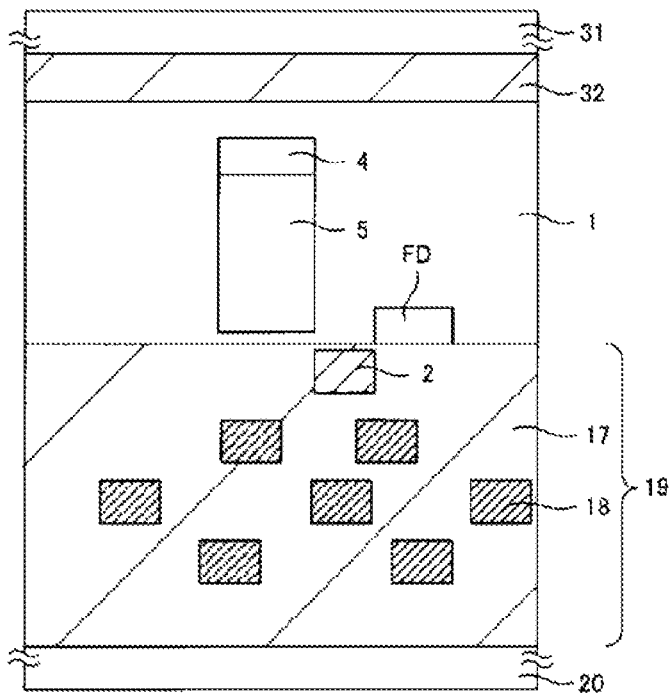
FIGS. 4E and 4F are diagrams illustrating a process of manufacturing of the solid-state imaging device of FIG. 1.
Figure 4:
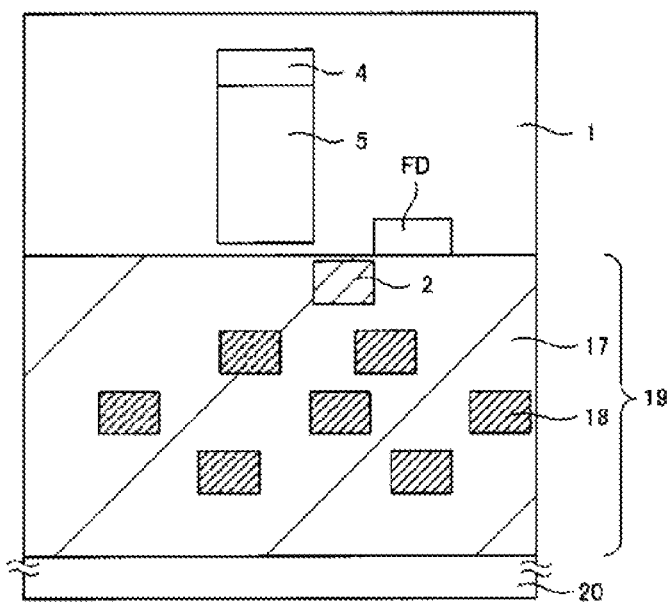

Next, as shown in FIG. 4E, the substrate is reversed upside down. Further, as shown in FIG. 4F, the silicon substrate 31 and the $SiO_2$ film 32 of the SOI substrate are removed.

Figure 5:
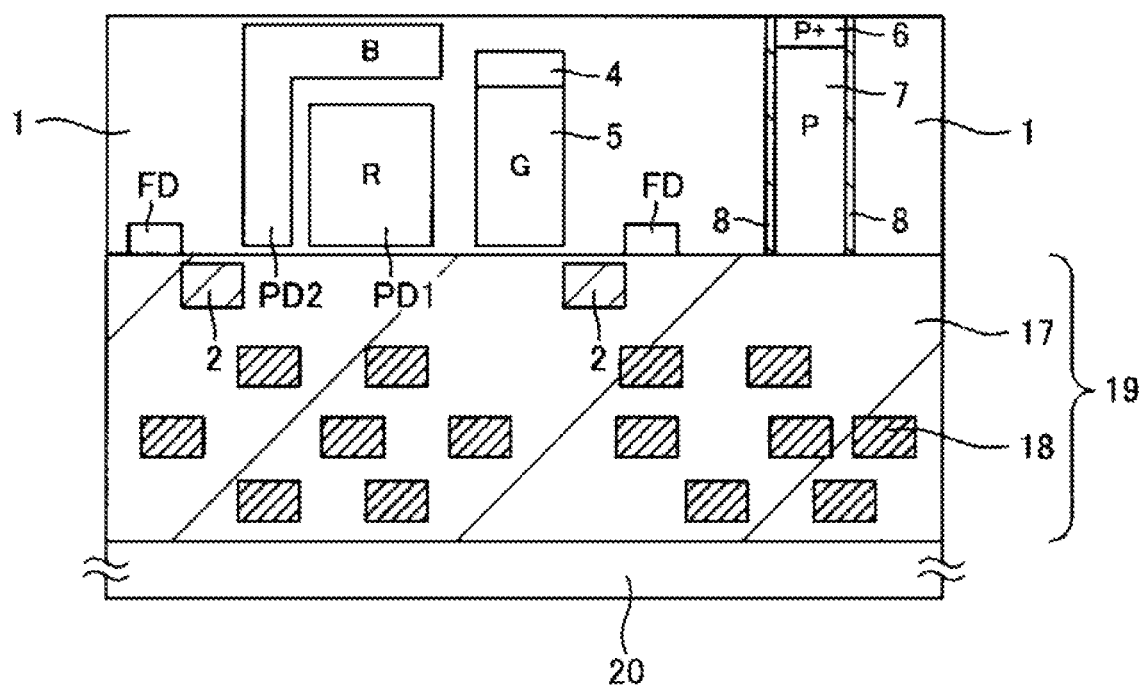
FIG. 5 is a cross-sectional view of an entire pixel in a state of FIG. 4F.

A cross-sectional view of the entire pixel in this state of FIG. 4F is shown in FIG. 5. In FIG. 5, two photoelectric conversion parts PD1 and PD2, the contact portion 6, the plug region 7, and the insulation film 8 are formed for the semiconductor base element 1 on the wiring part (multilayer interconnection layer) 19 in addition to the regions shown in FIG. 4F.

In the following process, a portion above from the semiconductor base element 1 and the transfer gate 2 is shown, and the wiring part (multilayer interconnection layer) 19 and the support substrate 20 are omitted.

Figure 6:
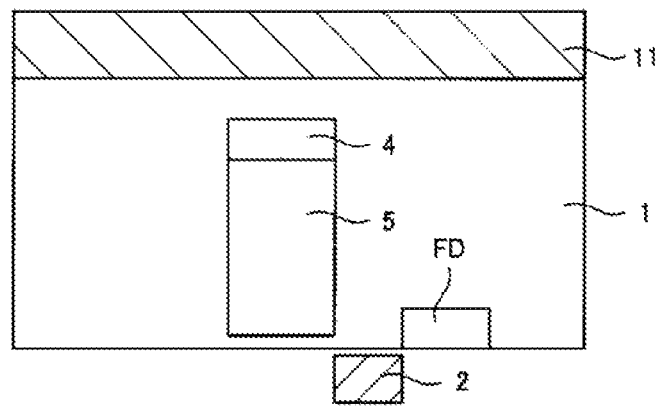
FIGS. 6A to 6C are diagrams illustrating a process of manufacturing of the solid-state imaging device of FIG. 1.
Figure 6:
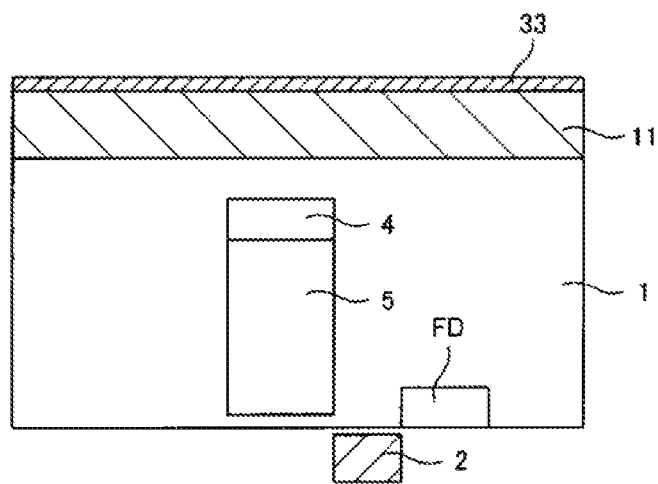
Figure 6:
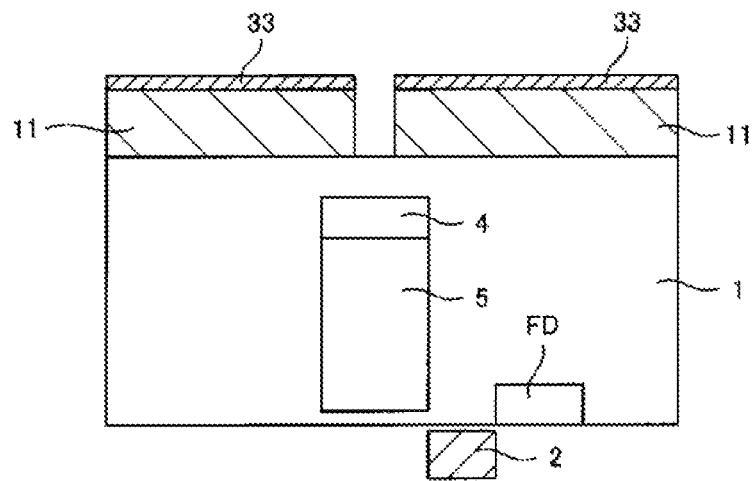

Then, as shown in FIG. 6A, the insulating layer 11 is formed on the semiconductor base element 1.

As for the insulating layer 11, as described above, a material with low interface state is preferably used for suppressing the dark current occurring from the interface between the semiconductor base element 1 and the insulating layer 11. For example, the insulating layer 11 is formed using a stacked film of a hafnium oxide film formed by the ALD method and a $SiO_2$ film formed by the plasma CVD method.

Subsequently, as shown in FIG. 6B, a laser light reflecting film 33 for reflecting a laser light is formed on the insulating layer 11. The laser light reflecting film 33 is formed preferably using a metal film such as W, Ti, and TiN, but not limited thereto.

Furthermore, as shown in FIG. 6C, an opening is formed in the insulating layer 11 and the laser light reflecting film 33 to form the contact hole which reaches the semiconductor base element 1.

Figure 7:
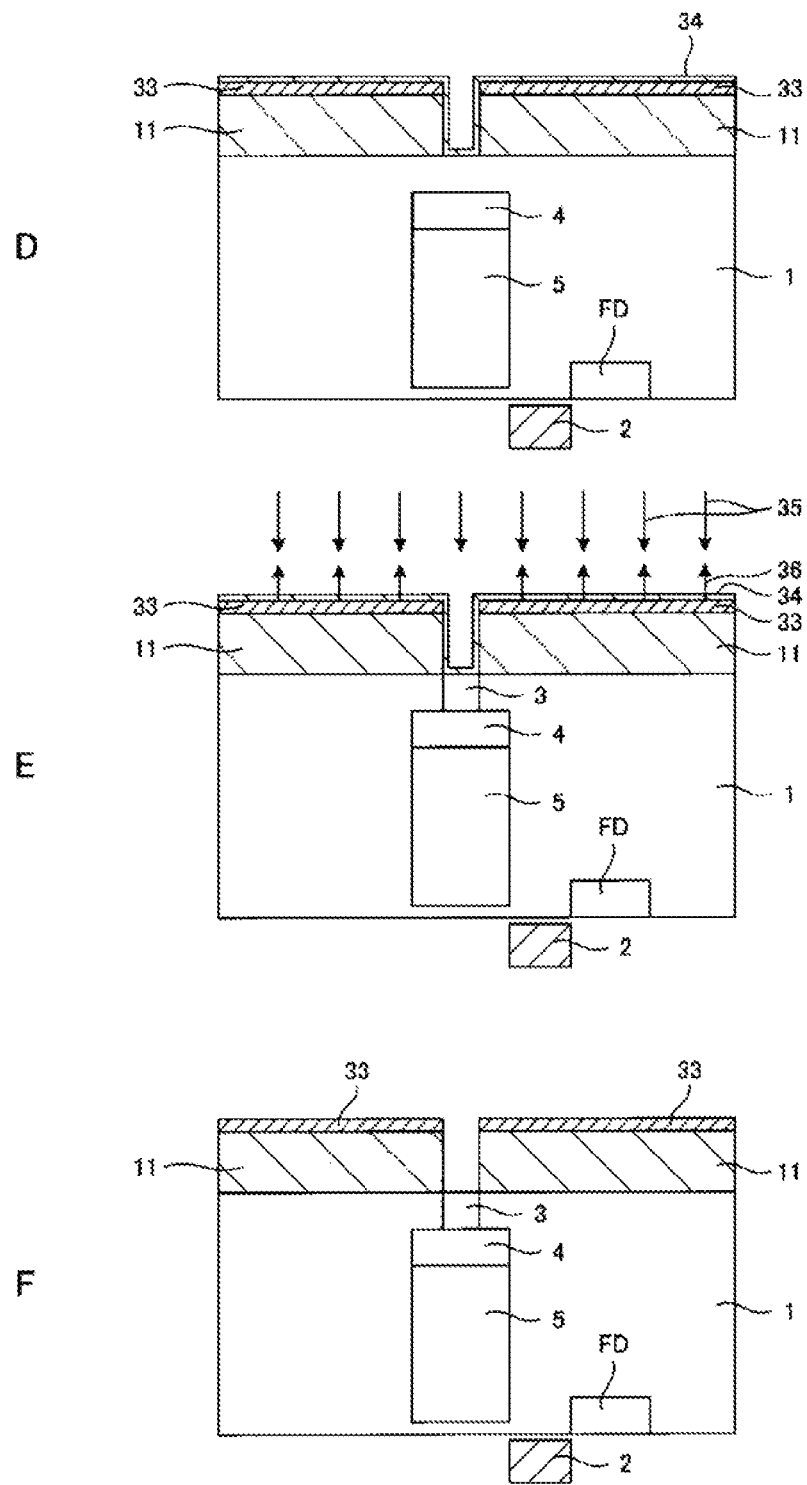
FIGS. 7D to 7F are diagrams illustrating a process of manufacturing of the solid-state imaging device of FIG. 1.

Next, as shown in FIG. 7D, a film 34 is formed which includes impurities to be diffused into the contact portion. Here, a film including n-type impurities such as phosphorus and arsenic is formed in order to form the contact portion 3 as the N+ region. For, example, a film of phosphosilicate glass is formed by the ALD (atomic layer deposition) method. The film 34 including impurities is formed to have a film thickness so as not to fully fill the contact hole.

An oxide film not including the impurities for preventing the impurities from diffusing outside may be formed above the film 34 including impurities.

Subsequently, laser annealing processing is performed on a pixel region so as to involve the contact portion. At this time, a condition of energy density to such an extent that the silicon is melted is applied.

As shown in FIG. 7E, since the laser light reflecting film 33 in the upper layer reflects the laser light 35 to be returned upward as a reflected light 36, only a portion of the semiconductor base element 1 corresponding to the contact hole is irradiated with the laser light 35. As a result, the impurities are diffused from the film 34 including impurities self-aligning with the contact hole, and at the same time the silicon in the semiconductor base element 1 is melted to activated the impurities. In this way, the $N^+$ contact portion 3 can be formed by self-alignment with the contact hole.

In laser annealing processing at this time, the silicon has to be melted to the degree of a thickness of an active layer (about 3 μm) or less. Accordingly, a wavelength of the laser light of laser annealing processing is set to 600 nm or less, and a condition of a short pulse width of 200 nanoseconds or less is applied.

Next, as shown in FIG. 7F, the film 34 including impurities is removed.

Figure 8:
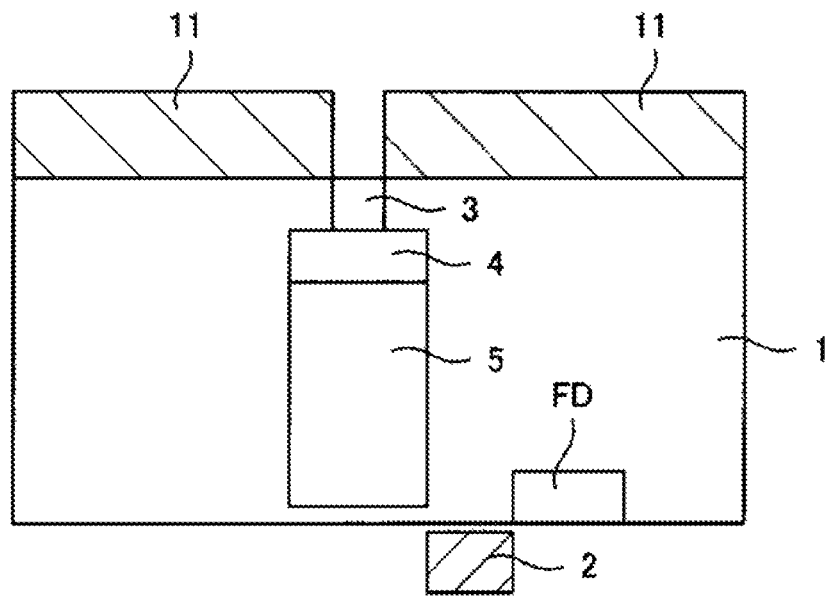
FIGS. 8G and 8H are diagrams illustrating a process of manufacturing of the solid-state imaging device of FIG. 1.
Figure 8:
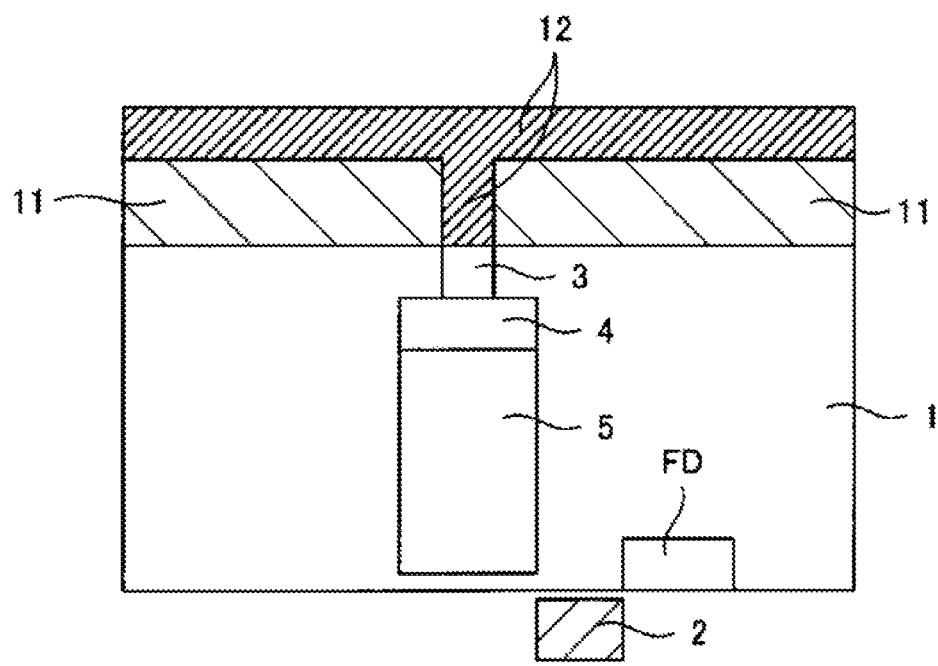

Then, as shown in FIG. 8G, the laser light reflecting film 33 is removed.

Subsequently, as shown in FIG. 8H, the conductive layer 12 is formed on the insulating layer 11 with the contact hole being filled. This forms the conductive layer 12 in the contact hole and the contact portion 3 by self-alignment.

The conductive layer 12 may be formed using the barrier metal having a stacked film of Ti and TiN, and the structure including W (tungsten) described above, for example.

Figure 9:
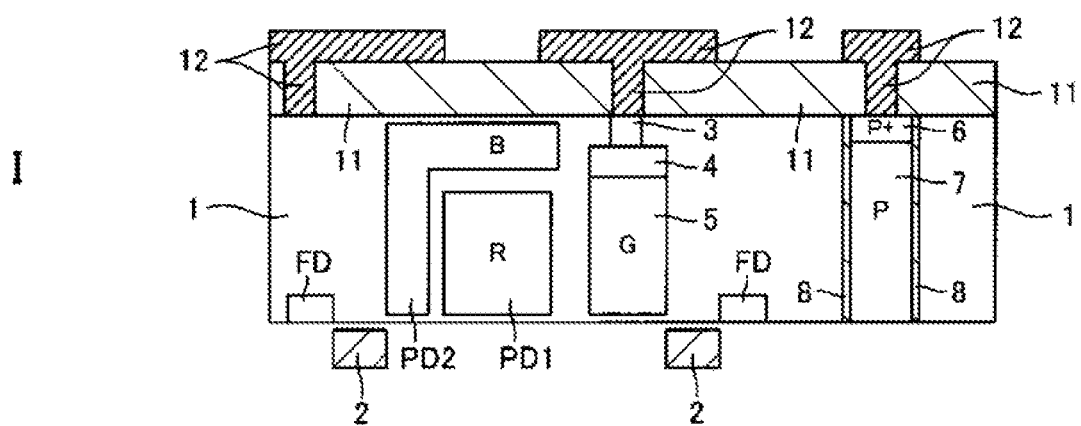
FIGS. 9I and 9J are diagrams illustrating a process of manufacturing of the solid-state imaging device of FIG. 1.
Figure 9:
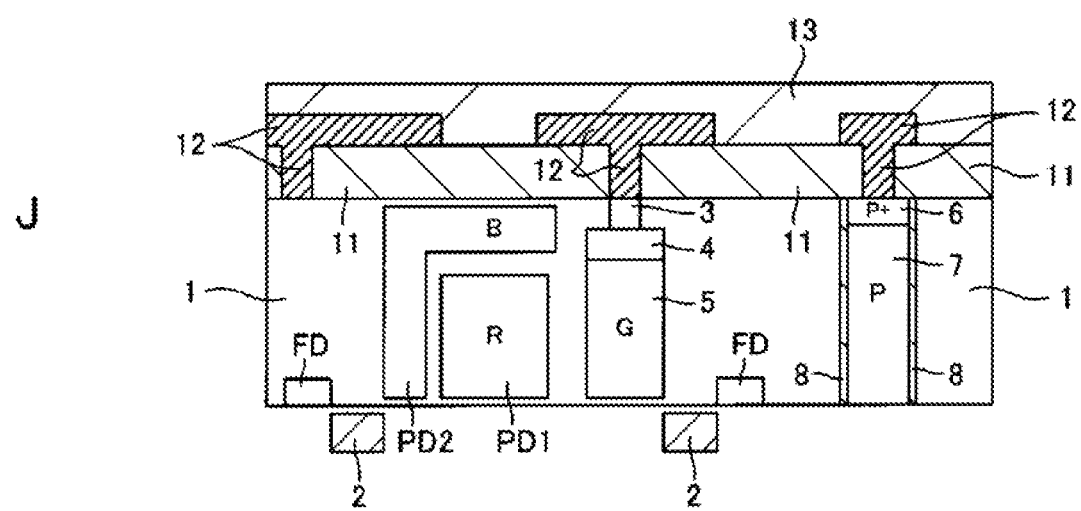

Further, the conductive layer 12 is processed such that a portion to be blocked from the light remains, and is formed to include the conductive plug and the wiring layer. A cross-sectional view of the entire pixel at this time is shown in FIG. 9I. As shown in FIG. 9I, the conductive layers 12 having a T-shaped cross section are formed in contact with the contact portion 3 and the contact portion 6, respectively.

In the following process, the cross-sectional view of the entire pixel is shown.

Next, as shown in FIG. 9J, the insulating layer 13 such as a $SiO_2$ film is formed on the insulating layer 11 covering over the conductive layer 12 by the plasma CVD method, for example. Thereafter, a surface of the insulating layer 13 is planarized by a CMP (chemical mechanical polishing) method, for example.

Then, the contact hole is formed in the insulating layer 13 that reaches the conductive layer 12.

Figure 10:
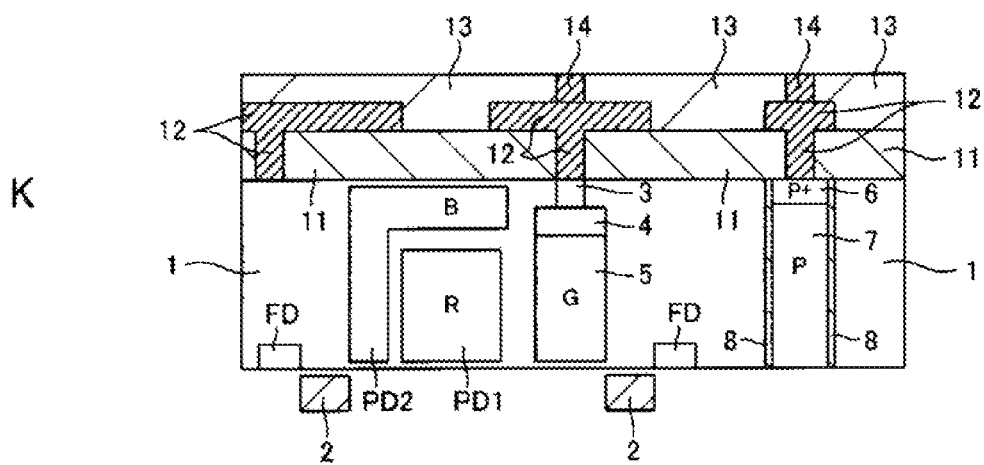
FIGS. 10K and 10L are diagrams illustrating a process of manufacturing of the solid-state imaging device of FIG. 1.
Figure 10:
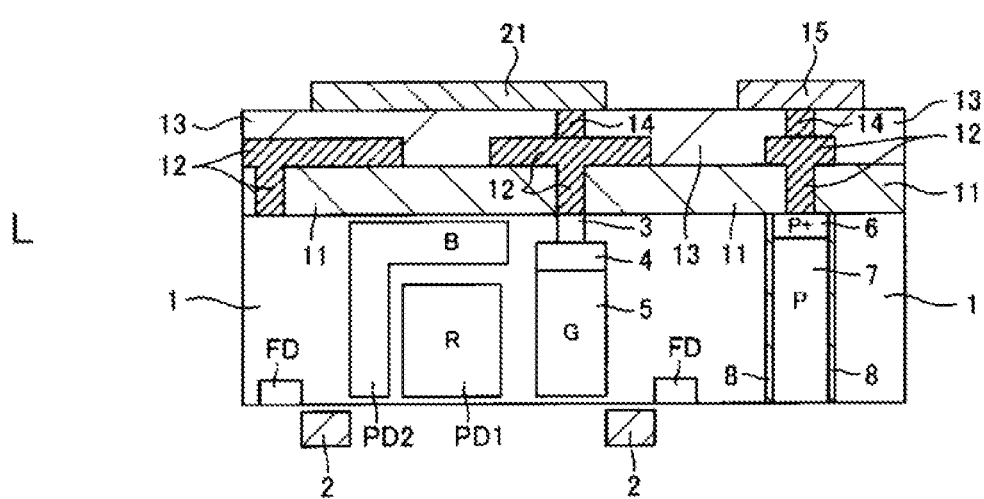

Subsequently, as shown in FIG. 10K, the conductive plug layer 14 is formed to fill the contact hole. The conductive plug layer 14 is formed by forming a stacked film of TiN and W and thereafter removing the excess W and TiN on the insulating layer 13 using the CMP method, for example.

Next, as shown in FIG. 10L, the lower electrode 21 of the organic photoelectric conversion part and the wiring layer 15 each are formed on the insulating layer 13 and the conductive plug layer 14.

The lower electrode 21 is formed by sputter-depositing an ITO film, photolithographically patterning the ITO film, and dry- or wet-etching the patterned film.

Examples of the materials of the lower electrode 21 are not limited to ITO, and various transparent conductive materials described above may be used.

When the wiring layer 15 is formed using the same material as the lower electrode 21, the wiring layer 15 and the lower electrode 21 may be formed at the same time by patterning.

When the wiring layer 15 is formed using the material different from the lower electrode 21, the wiring layer 15 is formed before or after the lower electrode 21 is formed. In this case, the material of the wiring layer 15 is not limited to the transparent conductive material unlike the lower electrode 21. Therefore, materials typically used for the wiring layer may be used.

Figure 11:
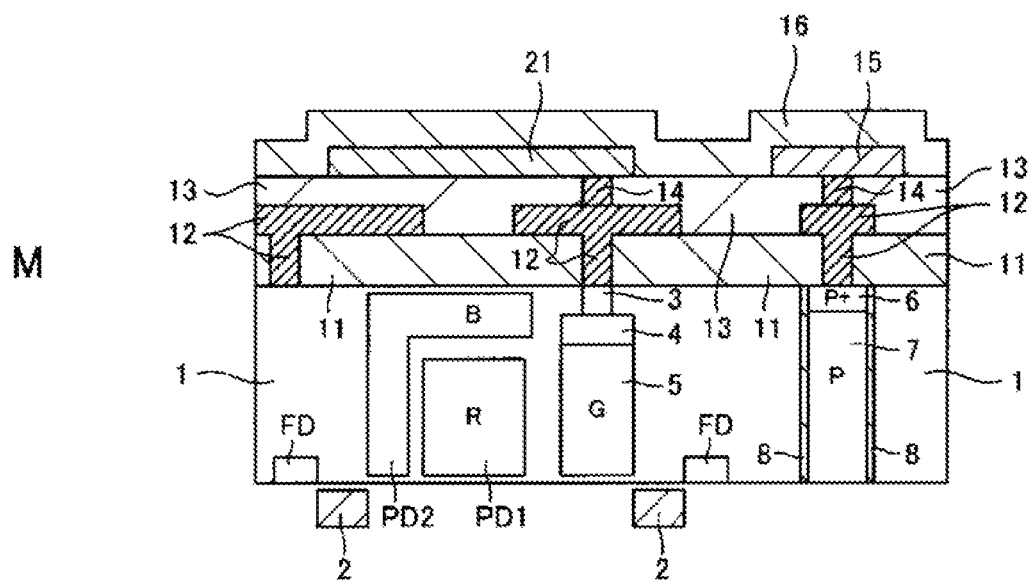
FIGS. 11M and 11N are diagrams illustrating a process of manufacturing of the solid-state imaging device of FIG. 1.
Figure 11:
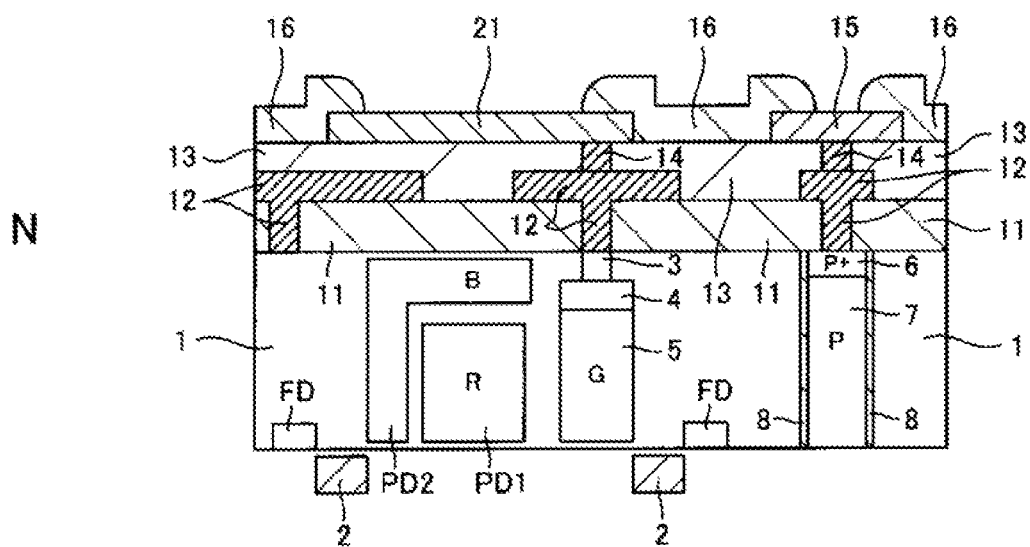

Next, as shown in FIG. 11M, a $SiO_2$ film is formed by the plasma CVD method, for example, to form the insulating layer 16 on the lower electrode 21 and the wiring layer 15.

Subsequently, the lower electrode is planarized by isotropic etching, for example, such that as shown in FIG. 11N, an opening is formed on the insulating layer 16 so as to reach the lower electrode 21 and the wiring layer 15.

Figure 12:
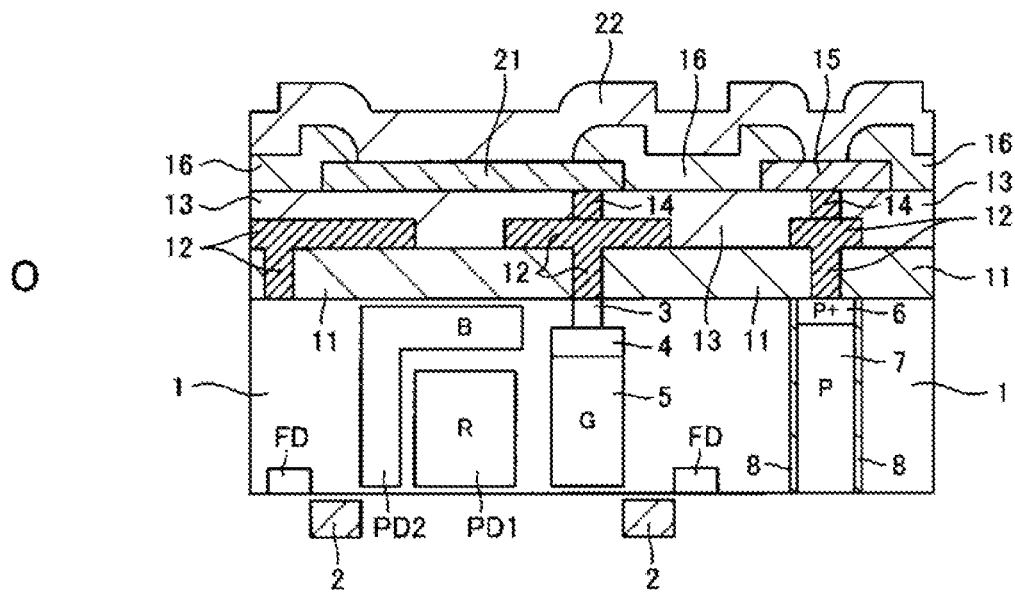
FIGS. 12O and 12P are diagrams illustrating a process of manufacturing of the solid-state imaging device of FIG. 1.
Figure 12:
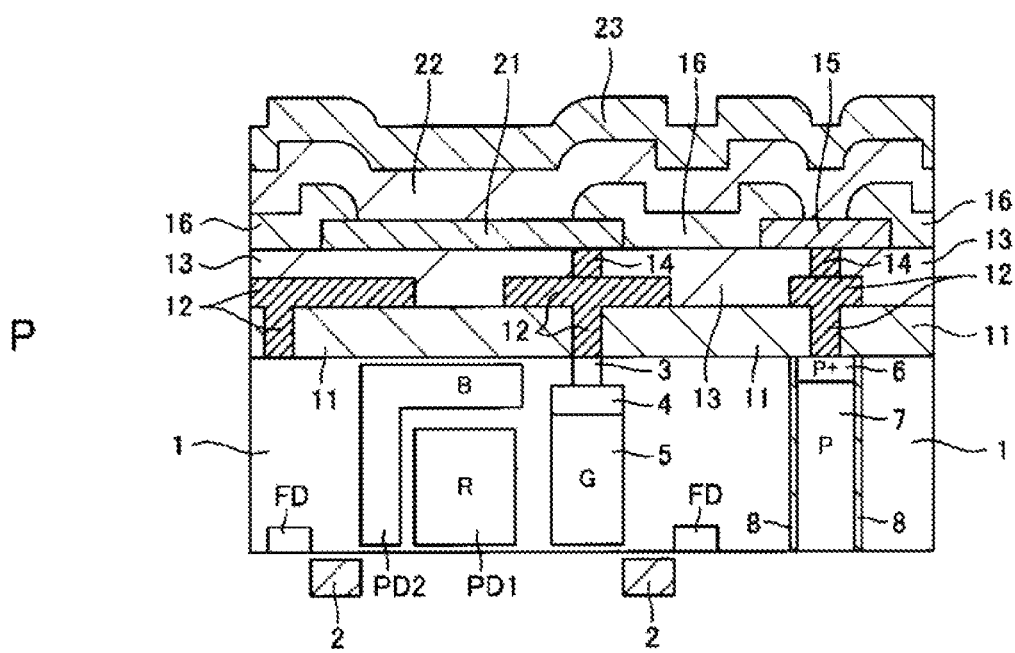

Then, as shown in FIG. 12O, the organic photoelectric conversion layer 22 is formed covering all over the surface. For example, in the case where quinacridone derivatives are used for the organic photoelectric conversion layer 22, the organic photoelectric conversion layer 22 can be formed by vacuum based deposition.

Furthermore, when the organic photoelectric conversion layer 22 is formed, a metal mask may not be necessarily used and the desired pattern may be formed using a print technology and the like.

Next, as shown in FIG. 12P, the upper electrode 23 is formed all over on the organic photoelectric conversion layer 22. The upper electrode 23 may be formed using the various materials such as ITO described above.

The organic photoelectric conversion layer 22 is known to have characteristics varying due to the effects of moisture, oxygen, hydrogen and the like.

For this reason, the upper electrode 23 is preferably formed with the organic photoelectric conversion layer 22 by a continuous vacuum process.

Then, a resist is patterned by photolithography technique, for example, to form a resist mask.

Figure 13:
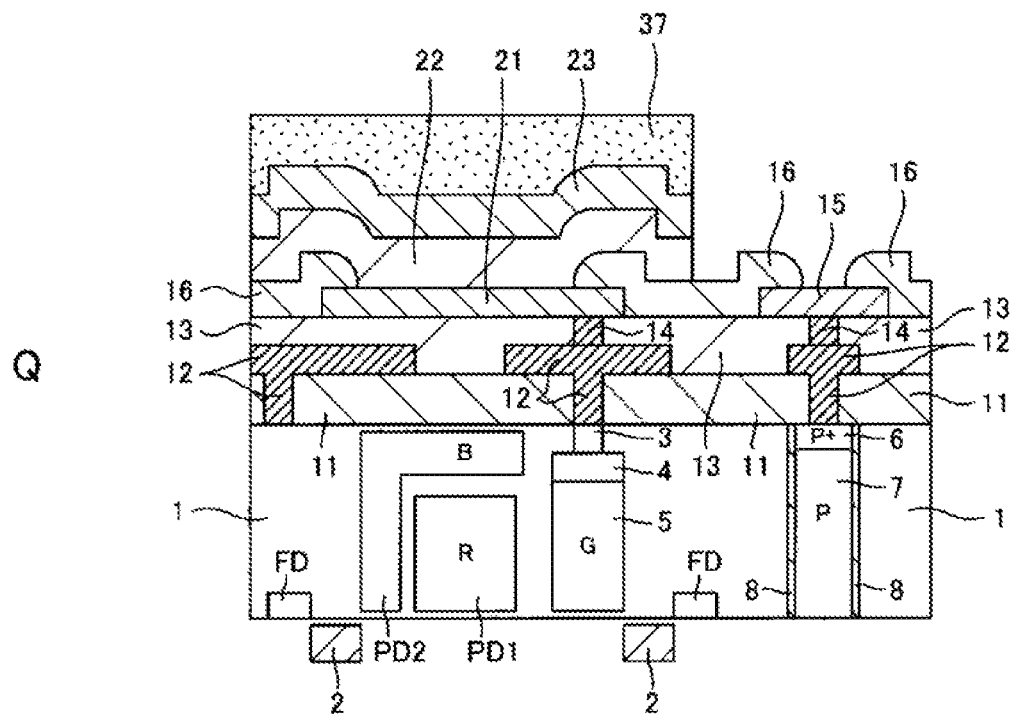
FIGS. 13Q and 13R are diagrams illustrating a process of manufacturing of the solid-state imaging device of FIG. 1.
Figure 13:
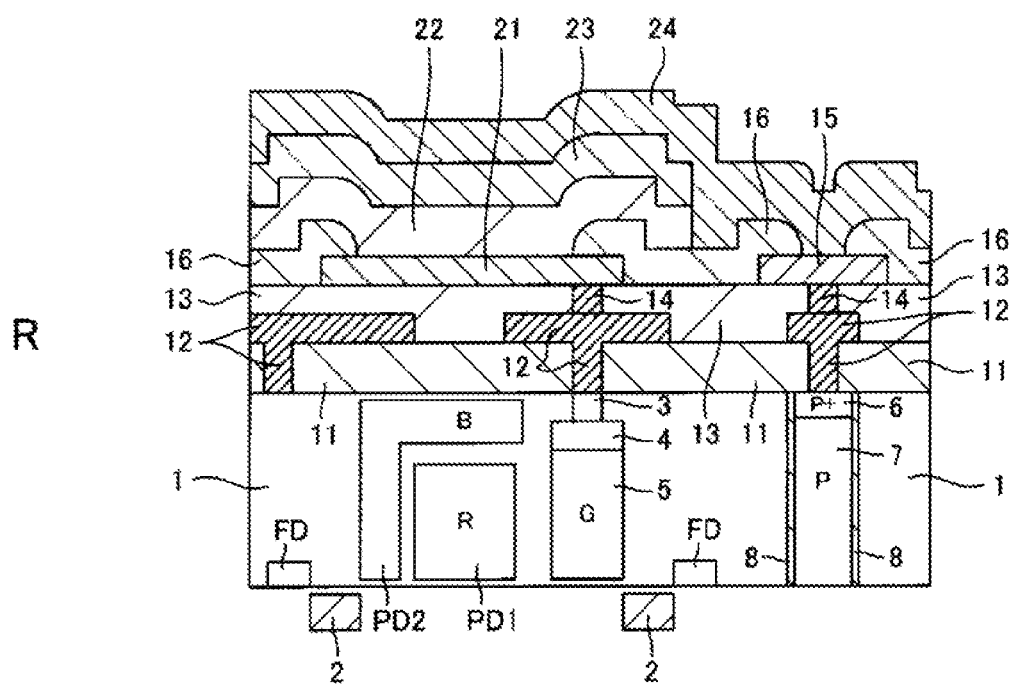

Subsequently, as shown in FIG. 13Q, a resist mask 37 is used to process in order the upper electrode 23 and the organic photoelectric conversion layer 22 by dry etching.

Thereafter, a post-processing such as ashing and organic cleaning is carried out to remove deposition substance and residual.

Next, as shown in FIG. 13R, the wiring layer 24 is formed covering all over the surface. Examples of the materials of the wiring layer 24 include a metal such as W, T, TiN, Al and the like, but not necessarily limited thereto.

Then, a resist is patterned by photolithography technique, for example, to form a resist mask.

Figure 14:
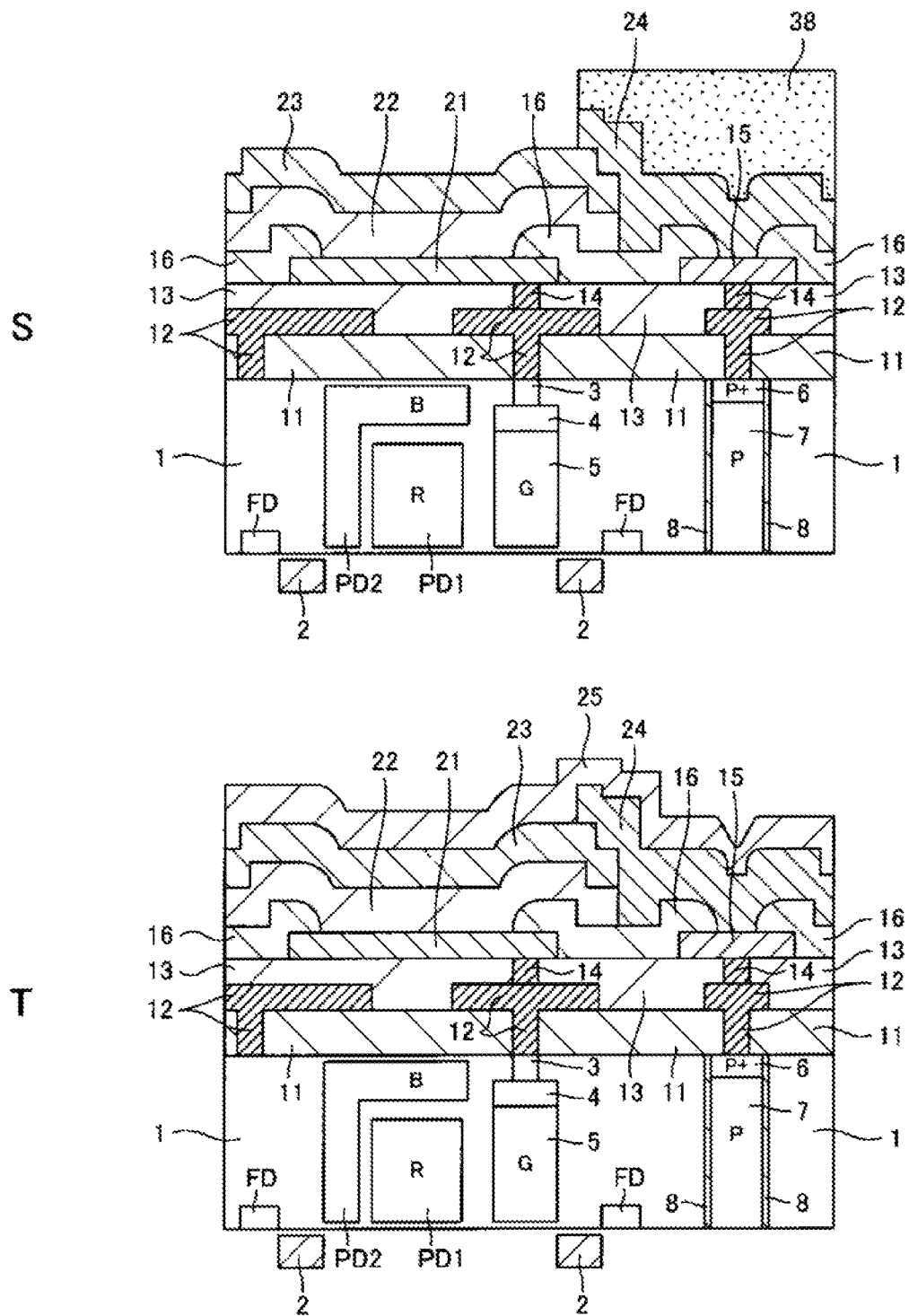
FIGS. 14S and 14T are diagrams illustrating a process of manufacturing of the solid-state imaging device of FIG. 1.

Subsequently, as shown in FIG. 14S, a resist mask 38 is used to pattern the wiring layer 24. This forms the wiring layer 24 in contact with the upper electrode 23 and the wiring layer 15, as shown in FIG. 14S.

Thereafter, as shown in FIG. 14T, the passivation layer 25 is formed covering all over the surface.

The passivation layer 25 may be formed using a SiN film and a SiON film formed by the plasma CVD method, but not limited to the method and films.

Figure 15:
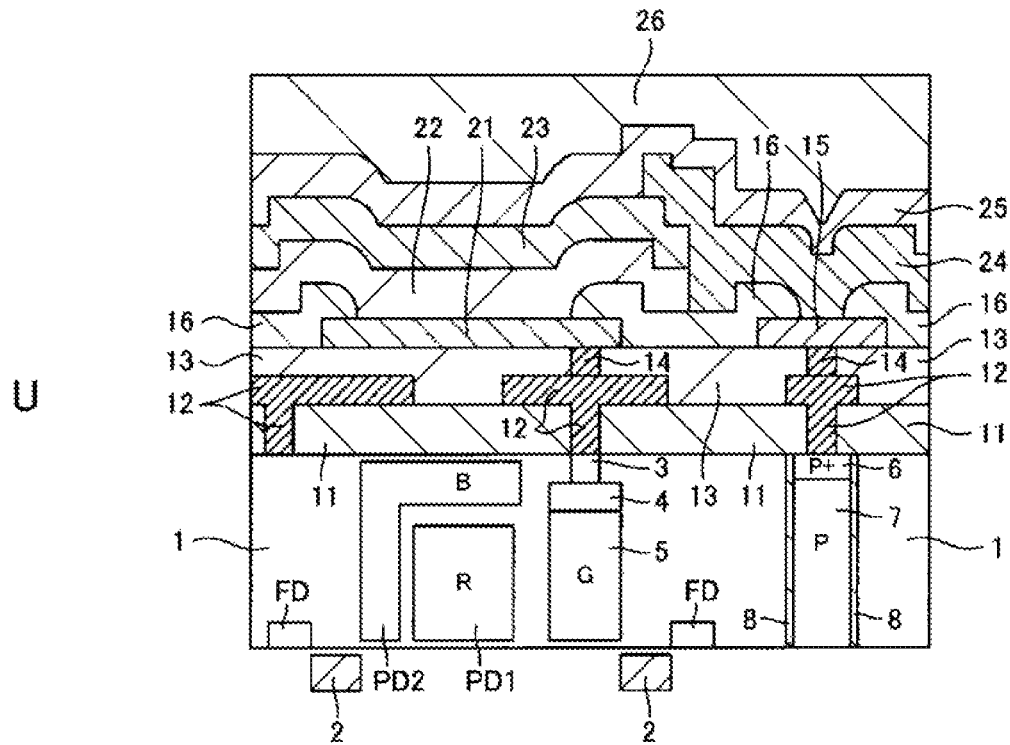
FIGS. 15U and 15V are diagrams illustrating a process of manufacturing of the solid-state imaging device of FIG. 1.
Figure 15:
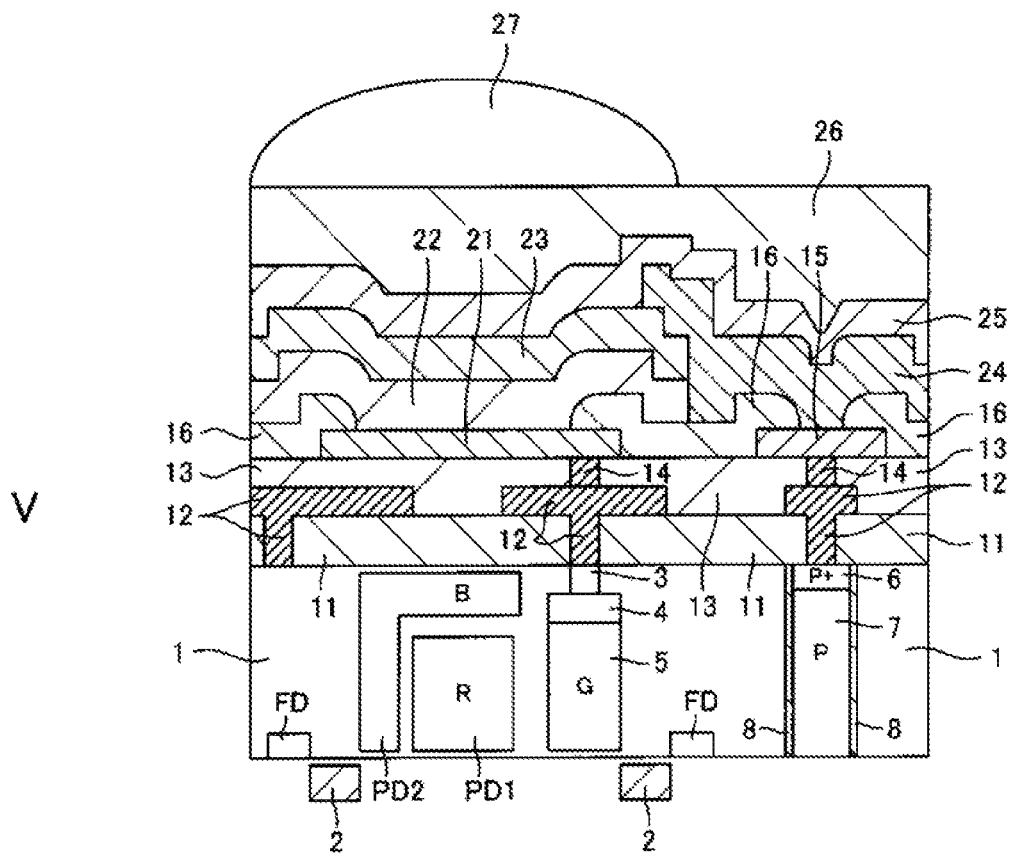

Next, as shown in FIG. 15U, the planarizing layer 26 is formed covering all over the surface by an SOG (Spin On Glass) method and the like.

Subsequently, as show in FIG. 15V, the on-chip lens 27 is formed on the planarizing layer 26.

In this way, the solid-state imaging device according to the embodiment shown FIG. 1 can be manufactured.

According to the structure of the solid-state imaging device in the embodiment described above, since the contact portion 3 is formed by self-alignment with the conductive layer 12 formed in the contact hole, the impurities of the contact portion 3 is not diffused outside the contact hole. This can suppress the junction leakage due to the spread depletion layer and the occurrence of the dark current due to the canceled negative fixed charge which are caused by diffusion of the impurities in the contact portion 3.

According to the manufacturing method of the solid-state imaging device in the embodiment described above, the laser light reflecting film 33 is formed on the insulating layer 11 on the semiconductor base element 1 to form the contact hole in the laser light reflecting film 33 and the insulating layer 11. Then, the film 34 including impurities is formed in the contact hole, the impurities are diffused from the film 34 including impurities by laser annealing, and the impurities are activated to form the contact portion 3 under the contact hole.

In laser annealing, since the laser light reflecting film 33 reflects the laser light, the portion under the contact hole is selectively melted, recrystallized and activated to able to form the contact portion 3 by self-alignment with the contact hole. At this time, the impurities of the contact portion 3 can be formed so as not to diffuse outside the contact hole, suppressing the junction leakage due to the spread depletion layer and the occurrence of the dark current due to the canceled negative fixed charge.

Then, the conductive layer 12 is formed in the contact hole in contact with the contact portion 3 of the semiconductor base element 1, the conductive layer 12 in the contact hole and the contact portion 3 are formed by self-alignment.

Furthermore, according to the manufacturing method of the solid-state imaging device of the embodiment, the contact portion 3 is formed utilizing the impurity diffusion from the film 34 including impurities and the laser annealing on the rear surface side of the semiconductor base element 1 (opposite to the circuit-formed surface).

According to this manufacturing method, as compared with a method in which the impurities are ion-implanted from the front surface side of the semiconductor base element 1 (circuit-formed surface side) and activated to form the contact portion, high energy ion implantation may not be necessary, leading to high concentration impurities of the contact portion 3.

According to the embodiment, since the junction leakage and the occurrence of the dark current can be suppressed, the contact portion 3 brought into electrically contact with the organic photoelectric conversion layer 22 can be formed by laser annealing with no difficulties.

Then, improvements in reliability and image quality can be secured in the solid-state imaging device and the electronic apparatus including the solid-state imaging device.

In the above embodiment, the organic photoelectric conversion part is set for the green G, the first photoelectric conversion part PD1 is set for the red R, and the second photoelectric conversion part PD2 is set for blue B as a combination of colors. However, other combinations of colors may be applied according to the embodiment of the present technology.

For example, the organic photoelectric conversion part may be set for the red R or the blue B, and two photoelectric conversion parts in the semiconductor base element may be set for other colors.

Examples of the photoelectric conversion materials for photoelectric-conversion with the red R light include a photoelectric conversion material containing phthalocyanine colorants.

Examples of the photoelectric conversion materials for photoelectric-conversion with the blue B light include a photoelectric conversion material containing coumaling colorants and merocyanine colorants.

According to the embodiment of the present technology, two layers of the organic photoelectric conversion parts are provided, and one layer of the photoelectric conversion part may be provided in the semiconductor base element.

Note that the semiconductor base element may not be provided with the photoelectric conversion part and three layers of the organic photoelectric conversion parts may be stacked on the semiconductor base element, however, by providing one or more photoelectric conversion parts in the semiconductor base element, the volume can be reduced.

In the above embodiment, description is given of the passivation layer 25 having a single layer structure, however, the passivation layer 25 may be a stacked structure having two or more layers.

In the above embodiment, the light incident surface and the circuit-formed surface of the semiconductor base element are formed on the different surfaces, that is, the so-called back-illuminated structure is employed.

The present technology may be applied to a front-illuminated structure in which the light incident surface and the circuit-formed surface of the semiconductor base element are formed on the same surface.

2. Second Embodiment

Manufacturing Method of Solid-State Imaging Device

Next, a manufacturing method of a solid-state imaging device according to a second embodiment is described.

According to the manufacturing method in this embodiment, the impurities are implanted into the semiconductor base element 1 by an ion implantation method or a plasma doping method, and diffused, instead of forming the film 34 including impurities shown in FIG. 7D to FIG. 7E.

Figure 16:
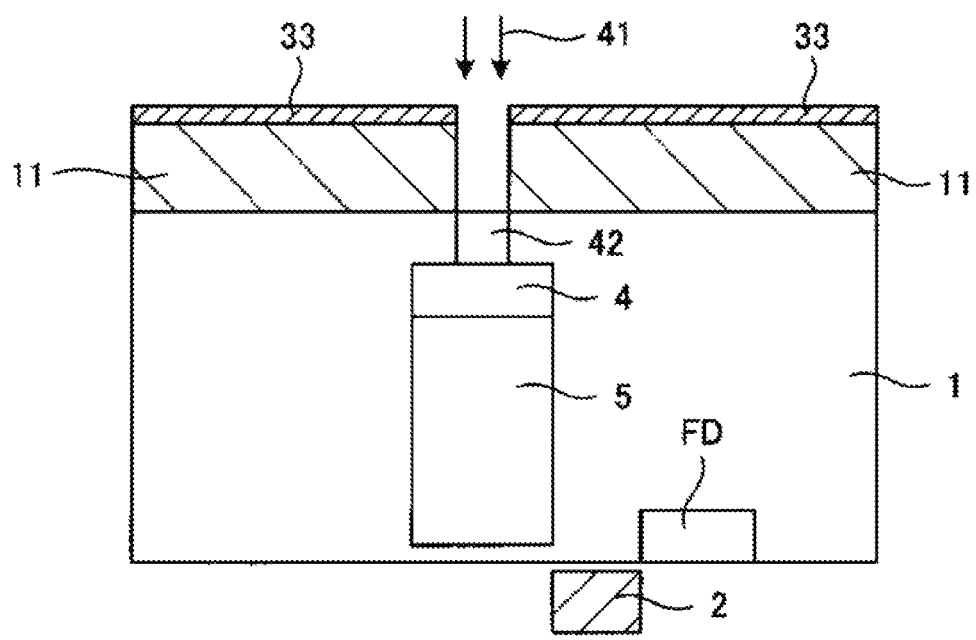
FIG. 16 is a diagram illustrating a process of manufacturing of a solid-state imaging device according to a second embodiment.

That is, after the process shown in FIG. 6C in the manufacturing method of the first embodiment, impurities 41 is implanted by the ion implantation method or the plasma doping method as shown in FIG. 16. This forms an impurity region 42 self-aligned with the contact hole in the semiconductor base element 1 as shown in FIG. 16.

Subsequently, laser annealing processing is performed on a pixel region so as to involve the contact portion, but not shown.

Since the laser light reflecting film 33 in the upper layer reflects the laser light to be returned upward as a reflected light, only a portion of the semiconductor base element 1 corresponding to the contact hole is irradiated with the laser light. As a result, the impurity region 42 formed by self-alignment with the contact hole is activated to form the contact portion 3 shown in FIG. 1. In this way, the N$^+$ contact portion 3 can be formed by self-alignment with the contact hole.

In the process after that, the solid-state imaging device shown in FIG. 1 can be manufactured similarly to the manufacturing method of the first embodiment.

According to the manufacturing method of the solid-state imaging device in the embodiment described above, the laser light reflecting film 33 is formed on the insulating layer 11 on the semiconductor base element 1, and the contact hole is formed in the laser light reflecting film 33 and the insulating layer 11. Then, the impurities 41 are implanted in the semiconductor base element 1 under the contact hole by the ion implantation method or the plasma doping method, and the impurities are activated by laser annealing to form the contact portion 3 under the contact hole.

In laser annealing, since the laser light reflecting film 33 reflects the laser light, the portion under the contact hole may be selectively melted, recrystallized and activated to form the contact portion 3 by self-alignment with the contact hole. At this time, the impurities of the contact portion 3 can be formed so as not to diffuse outside the contact hole, suppressing the junction leakage due to the spread depletion layer and the occurrence of the dark current due to the canceled negative fixed charge.

Then, since the conductive layer 12 is formed in the contact hole in contact with the contact portion 3 of the semiconductor base element 1, the conductive layer 12 in the contact hole and the contact portion 3 are formed by self-alignment.

According to the embodiment, since the junction leakage and the occurrence of the dark current can be suppressed, the contact portion 3 brought into electrically contact with the organic photoelectric conversion layer 22 can be formed by laser annealing with no difficulties.

Then, improvements in reliability and image quality can be secured in the solid-state imaging device and the electronic apparatus including the solid-state imaging device.

3. Third Embodiment

Manufacturing Method of Solid-State Imaging Device

Next, a manufacturing method of a solid-state imaging device according to a third embodiment is described.

According to the manufacturing method in this embodiment, the process of removing the laser light reflecting film 33 shown in FIG. 8G is not carried out, and subsequently the process of forming the conductive layer 12 is carried out.

Figure 17:
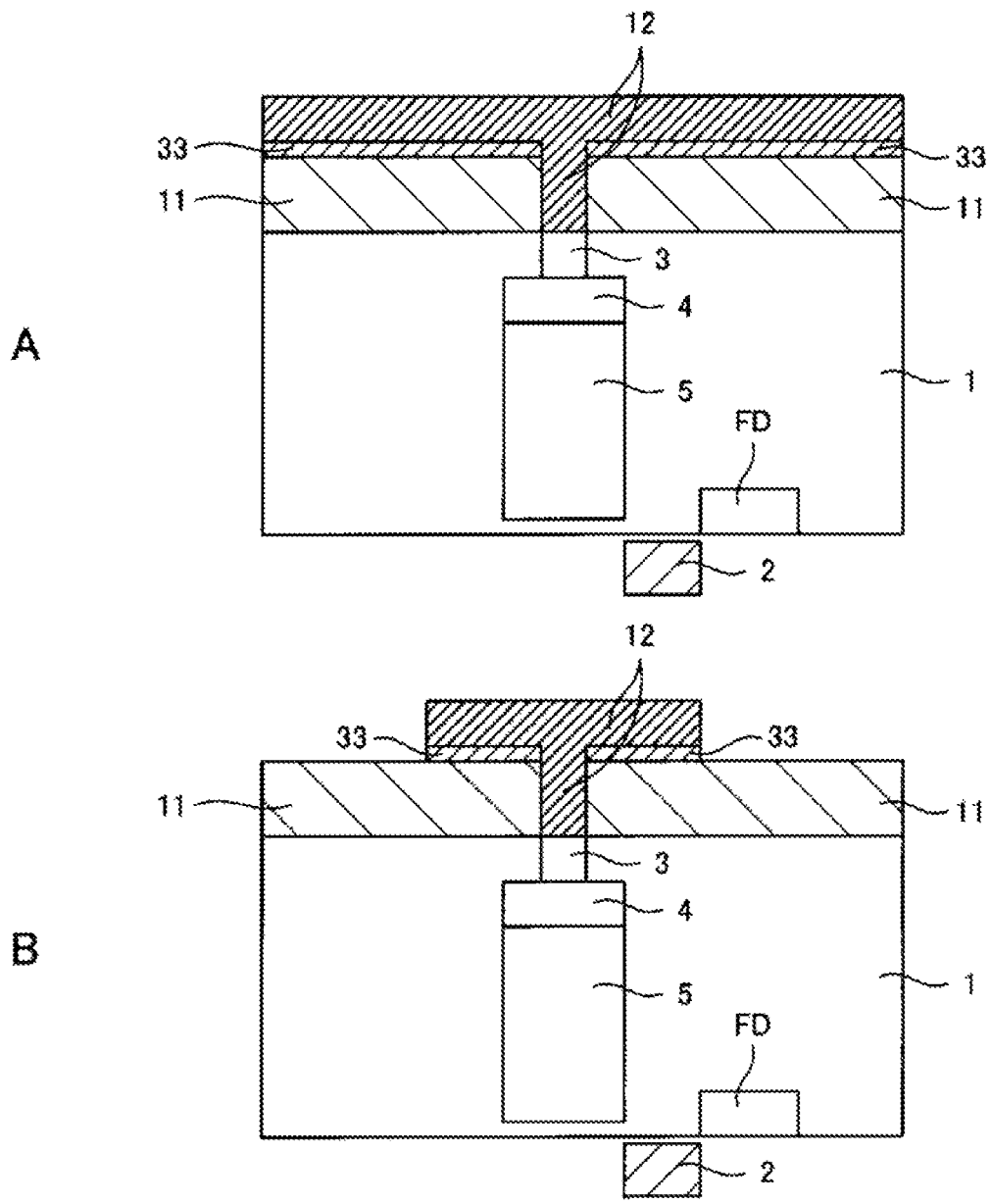
FIGS. 17A and 17B are diagrams illustrating a process of manufacturing of a solid-state imaging device according to a third embodiment.

That is, after the process shown in FIG. 7F in the manufacturing method of the first embodiment, the conductive layer 12 is formed in a state where the laser light reflecting film 33 is remained as shown in FIG. 17A.

Thereafter, the conductive layer 12 and the laser light reflecting film 33 are patterned to form a wiring portion which is to be a light blocking layer as shown in FIG. 17B.

In the process after that, the solid-state imaging device shown in FIG. 1 can be manufactured similarly to the manufacturing method of the first embodiment.

In the case of the manufacturing method according to the embodiment, a portion (wiring portion) to be the light blocking layer on the insulating layer 11 in the final manufactured solid-state imaging device is a stack of the laser light reflecting film 33 and the conductive layer 12. Other structures than this are similar to those of the solid-state imaging device shown in FIG. 1.

According to the manufacturing method of the solid-state imaging device in the embodiment described above, the contact portion 3 is formed under the contact hole similarly to the manufacturing method in the first embodiment.

Therefore, the impurities of the contact portion 3 can be formed so as not to diffuse outside the contact hole, suppressing the junction leakage due to the spread depletion layer and the occurrence of the dark current due to the canceled negative fixed charge.

Then, since the conductive layer 12 is formed in the contact hole in contact with the contact portion 3 of the semiconductor base element 1, the conductive layer 12 in the contact hole and the contact portion 3 are formed by self-alignment.

According to the embodiment, since the junction leakage and the occurrence of the dark current can be suppressed, the contact portion 3 brought into electrically contact with the organic photoelectric conversion layer 22 can be formed by laser annealing with no difficulties.

Then, improvements in reliability and image quality can be secured in the solid-state imaging device and the electronic apparatus including the solid-state imaging device.

4. Fourth Embodiment

Electronic Apparatus

Figure 18:
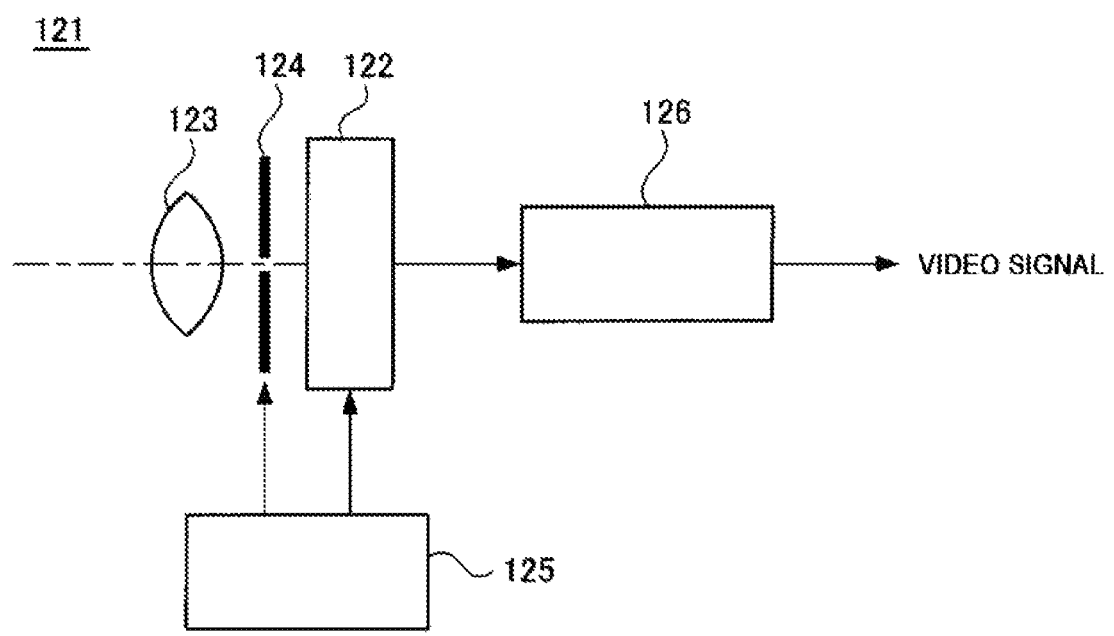
FIG. 18 is a schematic structural view (block diagram) of an electronic apparatus according to a fourth embodiment.

A schematic structural view (block diagram) of an electronic apparatus in the second embodiment is shown in FIG. 18.

This embodiment is a case where the present technology is applied to an electronic apparatus having a camera capable of shooting a still image or moving image.

As shown in FIG. 18, an electronic apparatus 121 includes a solid-state imaging device 122, an optical system 123, a shutter arrangement 124, a drive circuit 125 and a signal processing circuit 126.

The optical system 123 is constituted by an optical lens and the like, and an image light (incident light) from an object is focused into a pixel part of the solid-state imaging device 122. This allows a signal charge to be accumulated in the solid-state imaging device 122 for a certain period of time. The optical system 123 may be an optical lens system constituted by a plurality of optical lenses.

The solid-state imaging device according to the embodiment of the present technology including the solid-state imaging device in the embodiment described above is used as the solid-state imaging device 122.

The shutter arrangement 124 controls a light illumination period and a light blocking period for the solid-state imaging device 122.

The drive circuit 125 supplies a driving signal for controlling a transfer operation of the solid-state imaging device 122 and a shutter operation of the shutter arrangement 124. The signal transfer of solid-state imaging device 122 is performed according to the driving signal (timing signal) supplied from the drive circuit 125.

The signal processing circuit 126 performs various signal processes. A video signal subjected to the signal process is stored in a storage medium such as a memory or outputted to a monitor.

According to the structure of the electronic apparatus 121 in the embodiment described above, the solid-state imaging device according to the embodiment of the present technology including the solid-state imaging device in the embodiment described above or in modified example is used as the solid-state imaging device 122. This can enhance passivation properties for the organic photoelectric conversion layer to improve reliability of the solid-state imaging device 122 and the electronic apparatus 121 in the solid-state imaging device 122, and can enhance light collecting properties.

In the present technology, the structure of the electronic apparatus is not limited to that shown in FIG. 18, and other structures than that shown in FIG. 18 may be applied so long as they use the solid-state imaging device according to the present technology.

Additionally, the present technology may also be configured as below.

(1) A solid-state imaging device including:
a semiconductor base element;
an organic photoelectric conversion layer formed above the semiconductor base element;
a contact hole formed in an insulating layer on the semiconductor base element;
a conductive layer formed in the contact hole and electrically connecting a photoelectric conversion part which includes the organic photoelectric conversion layer with the semiconductor base element; and
a contact portion which is formed by self-alignment with the conductive layer in the contact hole in the semiconductor base element, and connected to the conductive layer.

(2) The solid-state imaging device according to (1),
wherein an organic photoelectric conversion part including the organic photoelectric conversion layer and the photoelectric conversion part formed in the semiconductor base element are vertically stacked.

(3) The solid-state imaging device according to (1) or (2),
wherein a back-illuminated structure is employed in which a light incident surface and a circuit-formed surface of the semiconductor base element are different surfaces.

(4) A manufacturing method of a solid-state imaging device having an organic photoelectric conversion layer including:
forming a reflecting film reflecting laser light on an insulating layer formed on a semiconductor base element;
processing the reflecting film and the insulating layer, and forming a contact hole that reaches the semiconductor base element;
forming a contact portion in the semiconductor base element under the contact hole by laser annealing;
forming a conductive layer in the contact hole with being connected to the contact portion in the semiconductor base element; and
forming a photoelectric conversion part that is electrically connected with the conductive layer and includes the organic photoelectric conversion layer above the semiconductor base element.

(5) The manufacturing method of a solid-state imaging device according to (4),
wherein, after forming the contact hole, a film including impurities is formed and thereafter the impurities are diffused from the film including impurities by laser annealing to form the contact portion.

(6) The manufacturing method of a solid-state imaging device according to (4),
wherein, after forming the contact hole, impurities are introduced into the semiconductor base element by an ion implantation method or a plasma doping method, and thereafter, the introduced impurities are activated by laser annealing to form the contact portion.

(7) An electronic apparatus including:
an optical system;
a solid-state imaging device according to any one of (1) to (3); and
a signal processing circuit processing an output signal of the solid-state imaging device.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2012-148659 filed in the Japan Patent Office on Jul. 2, 2012, the entire content of which is hereby incorporated by reference.

What is claimed is:

1. A solid-state imaging device, comprising:
a semiconductor base element that includes a charge accumulation part and two photoelectric conversion parts, wherein each of the two photoelectric conversion parts is adjacent to a first side of the charge accumulation part;
an organic photoelectric conversion part that includes an organic photoelectric conversion layer, wherein the organic photoelectric conversion layer is above the semiconductor base element;
a first insulating layer on the semiconductor base element, wherein the first insulating layer includes a first contact hole;
a second insulating layer on the first insulating layer, wherein the second insulating layer includes a second contact hole;
a conductive layer in the first contact hole, wherein
the conductive layer is configured to electrically connect the organic photoelectric conversion part with the semiconductor base element, and
the conductive layer comprises a light-blocking conductive material;
a conductive plug layer in the second contact hole, wherein the conductive plug layer is on the conductive layer;
an overflow barrier on the charge accumulation part;
a first contact portion on at least a portion of the overflow barrier, wherein
the overflow barrier is in contact with each of the first contact portion and the charge accumulation part, and
a width of the first contact portion is narrower than a width of the charge accumulation part;
a second contact portion in the semiconductor base element, wherein the second contact portion is in contact with the conductive layer;
a plug region, in the semiconductor base element, connected to the second contact portion, wherein
the plug region is adjacent to a second side of the charge accumulation part,
the first side of the charge accumulation part is opposite to the second side of the charge accumulation part, and
the conductive layer is connected to each of the plug region and the first contact hole; and
an insulation film in the semiconductor base element, wherein the insulation film covers the second contact portion and the plug region.

2. The solid-state imaging device according to claim 1, wherein
the organic photoelectric conversion part and the two photoelectric conversion parts are vertically stacked.

3. The solid-state imaging device according to claim 1, wherein a light incident surface of the semiconductor base element is different from a circuit-formed surface of the semiconductor base element.

4. An electronic apparatus, comprising:
an optical system;
a solid-state imaging device that includes:
a semiconductor base element that includes a charge accumulation part and two photoelectric conversion parts, wherein each of the two photoelectric conversion parts is adjacent to a first side of the charge accumulation part;
an organic photoelectric conversion part that includes an organic photoelectric conversion layer, wherein the organic photoelectric conversion layer is above the semiconductor base element;
a first insulating layer on the semiconductor base element, wherein the first insulating layer includes a first contact hole;
a second insulating layer on the first insulating layer, wherein the second insulating layer includes a second contact hole;
a conductive layer in the first contact hole, wherein
the conductive layer is configured to electrically connect the organic photoelectric conversion part with the semiconductor base element, and
the conductive layer comprises a light-blocking conductive material;
a conductive plug layer in the second contact hole, wherein the conductive plug layer is on the conductive layer;
an overflow barrier on the charge accumulation part;
a first contact portion on at least a portion of the overflow barrier, wherein
the overflow barrier is in contact with each of the first contact portion and the charge accumulation part, and
a width of the first contact portion is narrower than a width of the charge accumulation part;
a second contact portion in the semiconductor base element, wherein the second contact portion is in contact with the conductive layer;
a plug region, in the semiconductor base element, connected to the second contact portion, wherein
the plug region is adjacent to a second side of the charge accumulation part,
the first side of the charge accumulation part is opposite to the second side of the charge accumulation part, and
the conductive layer is connected to each of the plug region and the first contact hole; and
an insulation film in the semiconductor base element, wherein the insulation film covers the second contact portion and the plug region; and
a signal processing circuit configured to process an output signal of the solid-state imaging device.

5. The solid-state imaging device according to claim 1, wherein
the second contact portion connects the organic photoelectric conversion part with a circuit, and
the circuit is on a lower surface of the semiconductor base element.

6. The solid-state imaging device according to claim 1, wherein the insulation film insulates the semiconductor base element from the second contact portion and the plug region.

7. The solid-state imaging device according to claim 1, wherein the width of the first contact portion is same as a width of the first contact hole.

8. The solid-state imaging device according to claim 1, wherein a doping concentration of the second contact portion is different from a doping concentration of the plug region.

* * * * *